(12) United States Patent
Moura et al.

(10) Patent No.: US 9,601,362 B2
(45) Date of Patent: Mar. 21, 2017

(54) HIGH SPEED SUBSTRATE ALIGNER APPARATUS

(71) Applicants: Jairo T. Moura, Marlboro, MA (US); Martin Hosek, Lowell, MA (US); Todd Bottomley, Chesterfield, NH (US); Ulysses Gilchrist, Reading, MA (US)

(72) Inventors: Jairo T. Moura, Marlboro, MA (US); Martin Hosek, Lowell, MA (US); Todd Bottomley, Chesterfield, NH (US); Ulysses Gilchrist, Reading, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 402 days.

(21) Appl. No.: 14/042,248

(22) Filed: Sep. 30, 2013

(65) Prior Publication Data

US 2014/0147234 A1    May 29, 2014

Related U.S. Application Data

(63) Continuation of application No. 11/179,745, filed on Jul. 11, 2005, now Pat. No. 8,545,165, which is a (Continued)

(51) Int. Cl.
*H01L 21/68* (2006.01)
*H01L 21/677* (2006.01)
*H01L 21/687* (2006.01)

(52) U.S. Cl.
CPC ........ *H01L 21/68* (2013.01); *H01L 21/67748* (2013.01); *H01L 21/681* (2013.01);
(Continued)

(58) Field of Classification Search
CPC .............. H01L 21/68; H01L 21/68728; H01L 21/68707; H01L 21/68785; H01L 21/681;
(Continued)

(56) References Cited

U.S. PATENT DOCUMENTS 4,915,564 A  4/1990  Eror et al.
5,102,280 A  4/1992  Poduje et al.
(Continued)

FOREIGN PATENT DOCUMENTS

CN  1479667  3/2004
CN  101379604  12/2010
(Continued)

*Primary Examiner* — Scott Lowe
(74) *Attorney, Agent, or Firm* — Perman & Green, LLP; Colin C. Durham

(57) ABSTRACT

A substrate aligner providing minimal substrate transporter extend and retract motions to quickly align substrate without back side damage while increasing the throughput of substrate processing. In one embodiment, the aligner having an inverted chuck connected to a frame with a substrate transfer system capable of transferring substrate from chuck to transporter without rotationally repositioning substrate. The inverted chuck eliminates aligner obstruction of substrate fiducials and along with the transfer system, allows transporter to remain within the frame during alignment. In another embodiment, the aligner has a rotatable sensor head connected to a frame and a substrate support with transparent rest pads for supporting the substrate during alignment so transporter can remain within the frame during alignment. Substrate alignment is performed independent of fiducial placement on support pads. In other embodiments the substrate support employs a buffer system for buffering substrate inside the apparatus allowing for fast swapping of substrates.

16 Claims, 21 Drawing Sheets

Related U.S. Application Data continuation-in-part of application No. 11/093,479, filed on Mar. 30, 2005, now Pat. No. 7,891,936.

(52) U.S. Cl.
CPC ...... *H01L 21/682* (2013.01); *H01L 21/68707* (2013.01); *H01L 21/68728* (2013.01); *H01L 21/68785* (2013.01); *H01L 21/68792* (2013.01)

(58) Field of Classification Search
CPC ............. H01L 21/682; H01L 21/69792; H01L 21/67748
See application file for complete search history.

(56) References Cited

U.S. PATENT DOCUMENTS

| | | | |
|---|---|---|---|
| 5,339,027 | A | 8/1994 | Woith et al. |
| 5,491,618 | A | 2/1996 | Vakil |
| 5,568,969 | A | 10/1996 | Yu |
| 5,970,818 | A | 10/1999 | Kikuchi et al. |
| 6,126,380 | A | 10/2000 | Hillman |
| 6,126,381 | A | 10/2000 | Bacchi et al. |
| 6,275,742 | B1 | 8/2001 | Sagues et al. |
| 6,309,163 | B1 | 10/2001 | Nering |
| 6,357,996 | B2 | 3/2002 | Bacchi et al. |
| 6,435,807 | B1 | 8/2002 | Todorov et al. |
| 6,439,740 | B1 | 8/2002 | Yan |
| 6,468,022 | B1 | 10/2002 | Whitcomb |
| 6,494,589 | B1 | 12/2002 | Shyu |
| 6,530,732 | B1 | 3/2003 | Theriault et al. |
| 6,669,159 | B1 | 12/2003 | Hsu |
| 6,729,462 | B2 | 5/2004 | Babbs et al. |
| 6,860,790 | B2 | 3/2005 | Dvir |
| 7,019,817 | B2 | 3/2006 | Hashimoto et al. |
| 7,186,280 | B2 | 3/2007 | Eom et al. |
| 7,596,425 | B2 | 9/2009 | Asa |
| 2002/0048506 | A1 | 4/2002 | Babbs et al. |
| 2003/0053904 | A1 | 3/2003 | Kirihata et al. |
| 2003/0062578 | A1 | 4/2003 | Dougan et al. |
| 2003/0178988 | A1 | 9/2003 | Kim |
| 2003/0180127 | A1 | 9/2003 | Kuroda |
| 2005/0016818 | A1 | 1/2005 | Ito et al. |
| 2005/0028840 | A1 | 2/2005 | Lee et al. |
| 2005/0099817 | A1 | 5/2005 | Lin |
| 2006/0007176 | A1 | 1/2006 | Shen |
| 2006/0222477 | A1 | 10/2006 | Moura et al. |
| 2006/0245846 | A1 | 11/2006 | Moura et al. |
| 2006/0245847 | A1 | 11/2006 | Haris |

FOREIGN PATENT DOCUMENTS

| | | |
|---|---|---|
| JP | 6151566 | 5/1994 |
| JP | 2000021956 | 1/2000 |
| JP | 2000068357 | 3/2000 |
| JP | 2000208592 | 7/2000 |
| JP | 2000340639 | 12/2000 |
| JP | 2003163258 | 6/2003 |
| JP | 2004303796 | 10/2004 |
| KR | 2005008495 | 1/2005 |
| WO | 2006105156 | 10/2006 |

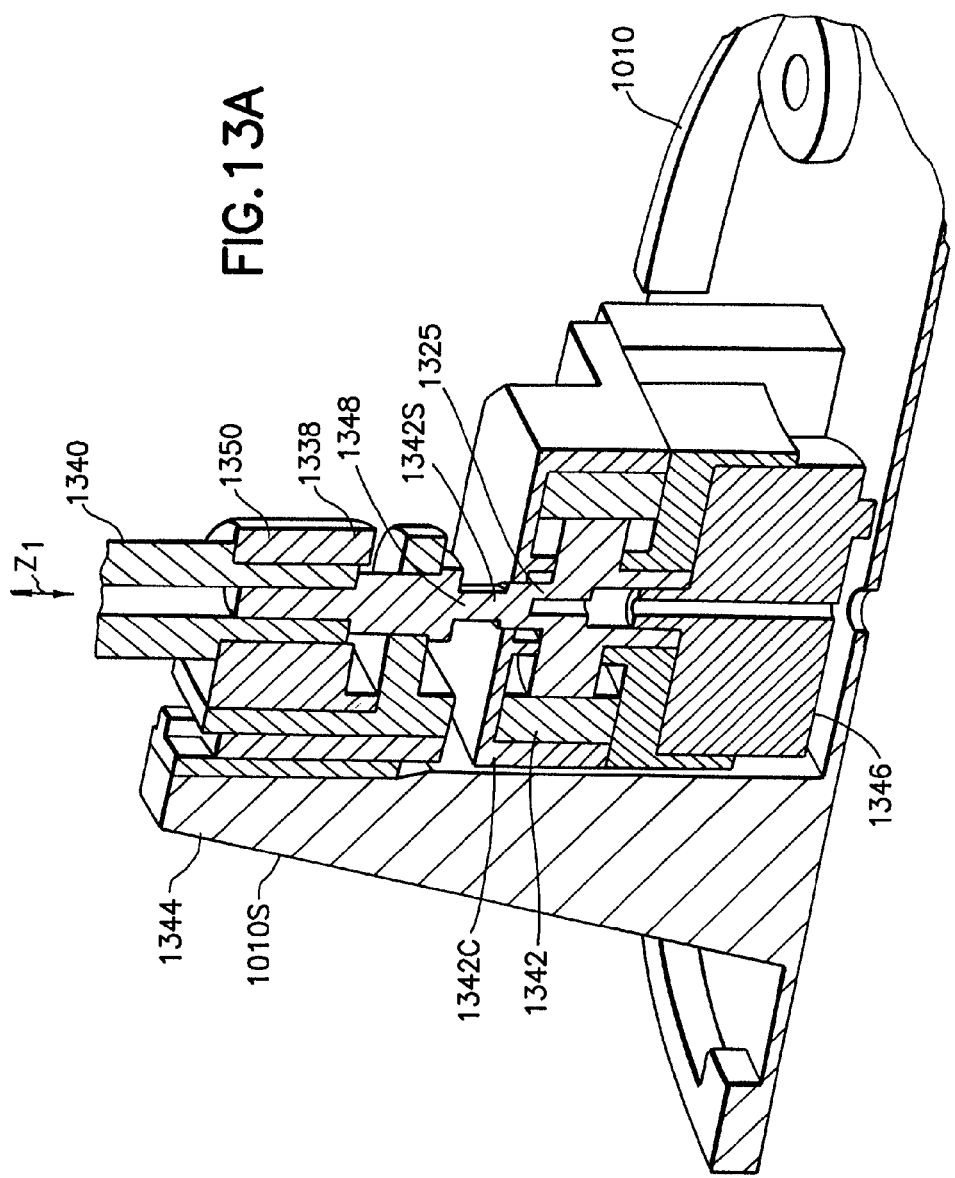

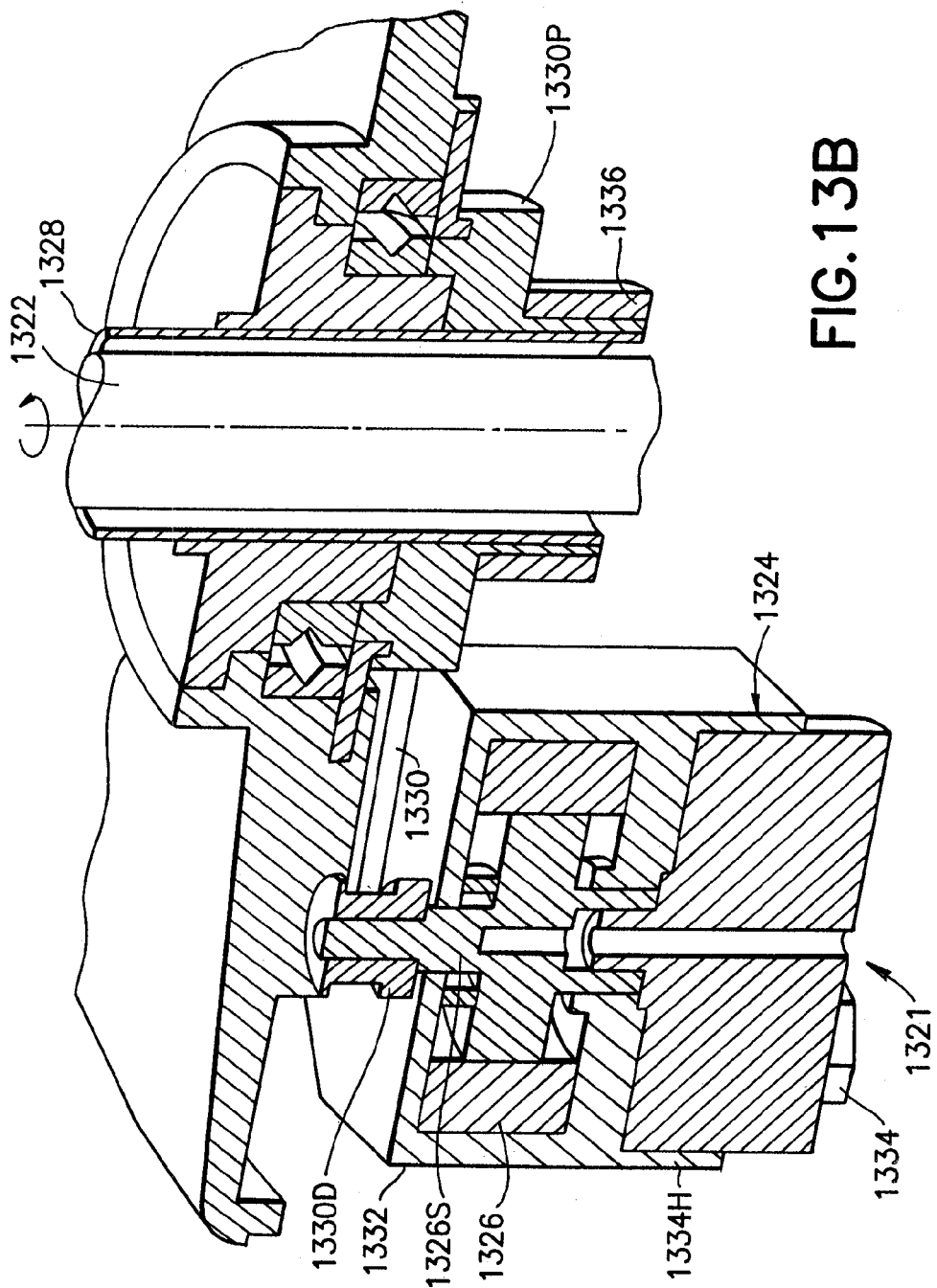

HIGH SPEED SUBSTRATE ALIGNER APPARATUS

This application is a divisional of U.S. application Ser. No. 11/179,745 filed on Jul. 11, 2005 which is a continuation-in-part, of U.S. patent application Ser. No. 11/093,479, filed Mar. 30, 2005 (now U.S. Pat. No. 7,891,936, issued Feb. 22, 2011).

BACKGROUND

1. Field

The exemplary embodiments disclosed herein relate to a substrate aligner apparatus.

2. Brief Description of Related Developments

Integrated circuits (IC) are produced from substrates (wafers) of semiconductor material. During IC fabrication wafers are typically housed in cassettes and moved to processing stations where the wafers are removed from the cassette via a substrate transporter and placed in a wafer aligner to effect a predetermined orientation that is desired for further processing of the wafer.

In conventional aligners, the substrate transporter may place the wafer on the wafer aligner and then move away from the aligner during the wafer alignment process. This results in increased wafer alignment times arising from the substrate transporter extension and retraction before and after the wafer alignment process. Also, if the alignment feature or fiducial of the wafer is placed over an aligner feature, such as the alignment chuck rest pads, masking the wafer fiducial from the fiducial sensor of the aligner, this will result in wafer placement and fiducial sensing re-tries, thereby further adding to the alignment time. Both the repeated movements of the substrate transporter during the alignment process and the obstruction of the wafer alignment feature create inefficiencies in the alignment process thereby decreasing the throughput of wafer processing and production.

Due to potential substrate transporter re-tries in placing the wafer on the aligner and the large numbers of wafers processed through the aligner, the time that is needed to align a batch of wafers for processing can increase substantially. Table 1 below illustrates a conventional alignment process with a conventional substrate aligner.

TABLE 1

| Pass Number | Description | Estimated Time (sec) |
| --- | --- | --- |
| 1 | Transporter extends to aligner | 1.0 |
| 2 | Places the wafer on the aligner chuck | 0.8 |
| 3 | Transporter partially retracts | 0.5 |
| 4 | Aligner scans 360 degrees for fiducial | 1.5 |
| 5 | If fiducial is not found (i.e. covered by the chuck pads) a retry is needed | — |
| 6 | Chuck goes to safe zone to clear the path for the transporter end effector | 0.4 |
| 7 | Transporter extends | 0.5 |
| 8 | Transporter lifts the wafer (no end effector edge grip actuation) | 0.3 |
| 9 | Aligner rotates chuck slightly towards the safe zone to uncover the notch | 0.2 |
| 10 | Transporter drops the wafer on chuck | 0.3 |
| 11 | Transporter retracts partially | 0.5 |

TABLE 1-continued

| Pass Number | Description | Estimated Time (sec) |
| --- | --- | --- |
| 12 | Aligner scans 360 deg. for fiducial and finds that at the post position the transporter pick path is obstructed | 1.5 |
| 13 | Transporter extends | 0.5 |
| 14 | Transporter lifts the wafer | 0.3 |
| 15 | Aligner moves the chuck to within the safe zone | 0.4 |
| 16 | Transporter drops the wafer on chuck | 0.3 |
| 17 | Aligner moves the chuck as close as possible to the desired post-position and the chuck within the safe zone | 0.2 |
| 18 | Repeat items 14-17 until the fiducial is at the desired post-position and the chuck within the safe zone | — |
| 19 | Transporter lifts and grips the wafer | 0.8 |
| 20 | Transporter retracts to home | 1.0 |
| Total Time | | >11 |

In addition to the increased alignment times, wafer walking may be induced into the alignment process as a result of the repeated lifting and placing of the wafer to and from the alignment chuck. Further, each additional pick of the wafer increases the possibility of backside damage or contamination.

With conventional aligner designs it is not possible to reliably detect the fiducial when it is placed on top of the chuck pad due to the use of a through beam sensor. It is also not possible to arbitrarily orient the wafer without obstructing the pick path of the substrate transporter nor is it guaranteed that the wafer be aligned in less than two substrate transporter re-tries. The number of re-tries needed to properly align the wafer with conventional aligners also jeopardizes the accuracy of the fiducial post position. In addition, the alignment of the wafer cannot be performed with the substrate transporter extended under the aligner, thus requiring additional extend/retract motions by the substrate transporter for each alignment operation performed.

U.S. Pat. No. 6,468,022 B1 and U.S. Pat. No. 6,357,996 B2 disclose examples of conventional substrate aligners that utilize edge rolling for wafer fiducial detection and expensive edge sensing devices. Another example of a conventional aligner apparatus is disclosed in U.S. Pat. No. 6,729,462, wherein the aligner has first and second buffer arms and a chuck arm. The chuck arm is used to align a workpiece. The chuck arm transfers the aligned workpiece to the buffer arms, and a second workpiece is aligned with the chuck arm.

The exemplary embodiments of the present invention overcome the problems of conventional wafer aligners as will be described further below.

SUMMARY OF THE EXEMPLARY EMBODIMENTS

In accordance with one exemplary embodiment of the present invention a substrate aligner apparatus is provided comprising a frame, an inverted chuck, a sensing device and a substrate transfer mechanism. The frame is adapted to allow a substrate transporter to transport a substrate to and from the aligner apparatus. The inverted chuck is capable of holding the substrate and is movably connected to the frame by a chuck driveshaft engaged to the inverted chuck for moving the inverted chuck relative to the frame and effecting alignment of the substrate. The sensing device, for detecting a position determining feature of the substrate, is located between the chuck and the chuck driveshaft. The substrate transfer mechanism is movably connected to the frame and is located inside the frame below the inverted chuck for moving the substrate from the inverted chuck to the substrate transporter.

In accordance with another exemplary embodiment of the present invention a substrate aligner apparatus is provided comprising a frame and an edge gripping chuck system. The frame is adapted to allow an edge gripping substrate transporter to transport a substrate to and from the aligner apparatus. The edge gripping chuck system is connected to the frame for holding and rotationally positioning the substrate to a predetermined post alignment substrate orientation. The chuck system is configured to effect the predetermined post alignment substrate orientation independent of the substrate transporter so that regardless of the predetermined post alignment substrate orientation relative to the transporter, post alignment transfer of the substrate to the transporter can be effected without rotational repositioning of the substrate.

In accordance with another exemplary embodiment of the present invention a substrate aligner apparatus is provided comprising a frame, a rotatable sensor head and a substrate support. The frame is adapted to allow a substrate transporter to transport a substrate to and from the aligner apparatus. The rotatable sensor head has at least one sensing device for detecting a position determining feature of the substrate and is movably connected to the frame by a driveshaft engaged to the rotatable sensor head for moving the rotatable sensor head relative to the frame. The substrate support is mounted to the frame for supporting the substrate when the position determining feature is detected by the rotatable sensor head. The substrate support has support pads contacting a peripheral edge of the substrate and the sensing device is capable of detecting the position determining feature independent of the location of the position determining feature relative to the support pads.

In accordance with still another exemplary embodiment of the present invention a substrate aligner apparatus is provided comprising a frame, a drive section connected to the frame, a first substrate interface and a second substrate interface. The frame is adapted to allow a substrate transporter to transport a substrate to and from the aligner apparatus. The first substrate interface section is movably connected to the frame for directly interfacing with the substrate and operably connected to the drive section for effecting movement of the first substrate interface section relative to the frame. The second substrate interface section is movably connected to the frame for directly interfacing with the substrate and operably connected to the drive section for effecting movement of the second substrate interface section relative to the frame. The first substrate interface section is moved for effecting detection of a position determining feature of the substrate, and the second substrate interface is moved for effecting repositioning of the substrate.

BRIEF DESCRIPTION OF THE DRAWINGS

The foregoing aspects and other features of the present invention are explained in the following description, taken in connection with the accompanying drawings, wherein:

FIGS. 13, and 13A-13B are respectively a cutaway perspective view of a support section of the aligner apparatus, a cross-sectional view of a linear drive portion of the aligner apparatus and a rotational drive portion of the apparatus;

DETAILED DESCRIPTION OF THE EXEMPLARY EMBODIMENTS

Figure 1:
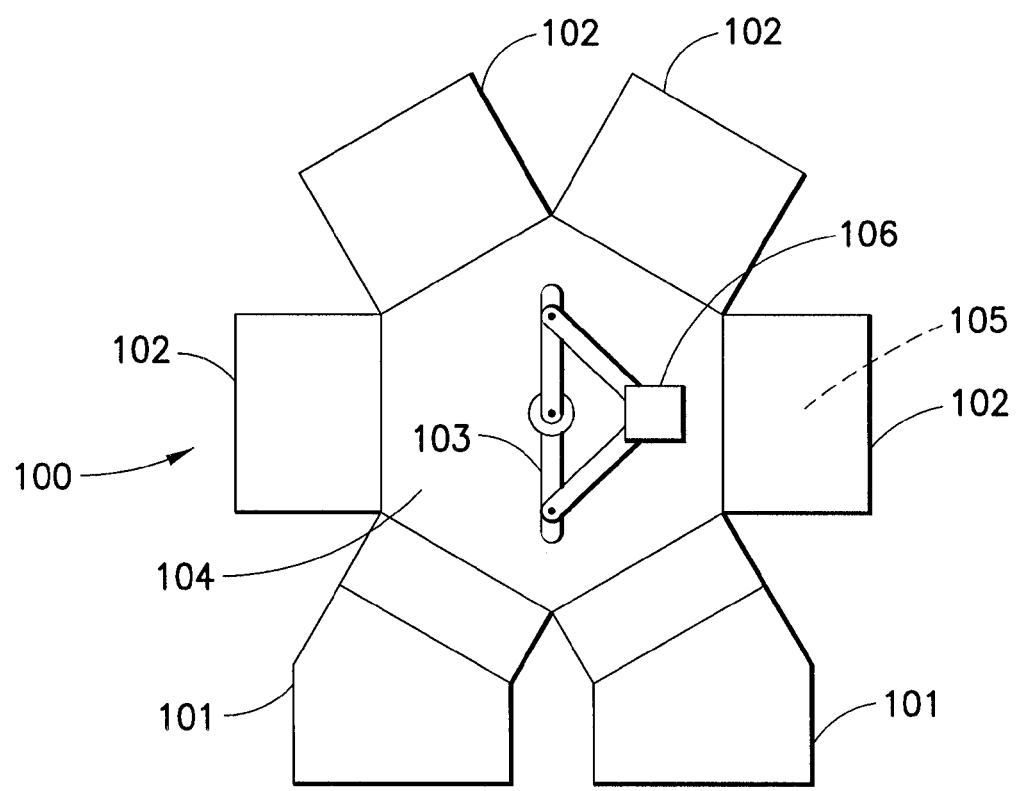
FIG. 1 is a schematic top plan view of a substrate processing apparatus incorporating features in accordance with an exemplary embodiment of the present invention.

Although the present invention will be described with reference to the exemplary embodiments shown in the drawings and described below, it should be understood that the present invention can be embodied in many alternate forms of embodiments. In addition, any suitable size, shape or type of elements or materials could be used.

Referring to FIG. 1, there is shown a schematic top plan view of a semiconductor substrate processing apparatus 100 incorporating features of the present invention. The processing apparatus shown in FIG. 1 is a representative processing apparatus with multiple substrate processing chambers 102. At least one of the processing chambers 102 has a substrate aligner apparatus 105. In addition to the multiple substrate processing chambers 102, which may be connected to a transfer chamber 104, the substrate processing apparatus 100 may include substrate cassette holders 101 that are also connected to the chamber 104. A substrate transporter 103 is also located, at least partially, in the chamber 104 and is adapted to transport substrates, such as semiconductor wafers, between and/or among the substrate processing chambers 102 and the cassette holders 101. The substrate transporter 103 has an end effector (substrate holder) 106 for holding the substrate. The substrate transporter 103 shown in FIG. 1 is exemplary and may have any other suitable arrangement. Examples of substrate transporters that may be used in the processing apparatus 100 may be found in U.S. Pat. No. 6,485,250 B2, U.S. Pat. No. 6,231,297, U.S. Pat. No. 5,765,983 and U.S. Pat. No. 5,577,879 all of which are incorporated herein by reference in their entirety. The substrate transporter may be of the scara type or it may have multiple linkages effecting the linear movement of the end effector. The substrate transporter 103 may have one or more end effectors 106, each capable of holding one or more wafers. The end effector 106 may also be an edge gripping or vacuum gripping end effector. In alternate embodiments, the substrate processing apparatus 100 may have any other desired configuration with any desired number of chambers.

Any suitable type of substrate may be processed in the semiconductor processing apparatus 100 and by the aligner 105 such as semiconductor wafers having a diameter of 200 mm or 300 mm. The semiconductor wafers generally have an alignment or reference mark (fiducial) 220 (See FIG. 3) for aligning the wafer according to a predetermined orientation.

In the case of integrated circuit production, the integrated circuits are produced from wafers of semiconductor material. The wafers may be housed in cassettes having one or more closely spaced slots, each slot capable of holding a wafer. The cassette may be placed on a first substrate cassette holder 101 for loading or unloading the apparatus 100. The substrate transporter 103 then grips a wafer with the end effector 106 and transports it to a substrate processing chamber 102 incorporating the substrate aligner apparatus 105.

The aligner apparatus 105 in one embodiment, as described below, generally has a frame, a chuck, a sensing device and a substrate transfer mechanism. The end effector 106 places the wafer on the aligner chuck where the wafer is rotated so that the sensing device can detect the position of the fiducial. The wafer is aligned to a predetermined position for subsequent processing. Post alignment, the wafer may be removed from the aligner by the substrate transporter end effector 106 and transported to other substrate processing chambers 102 for further processing. The substrate aligner 105 effects the detection and alignment of the fiducial independent of fiducial orientation and independent of the end effector 106 location within the aligner 105. Once the wafer is processed, the substrate may be placed in a cassette on the other substrate cassette holder 101.

Figure 2A:
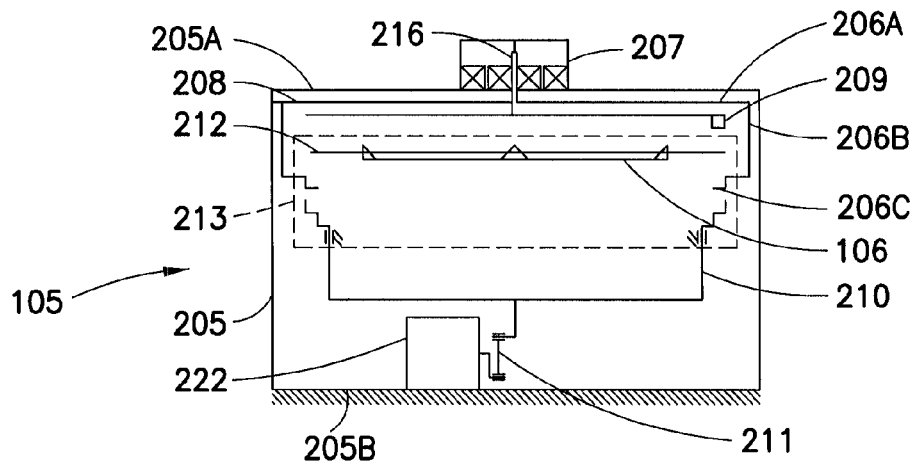
FIG. 2A is a schematic side view of a substrate aligning apparatus of the processing apparatus in FIG. 1 showing the aligner apparatus in a first configuration.
Figure 2B:
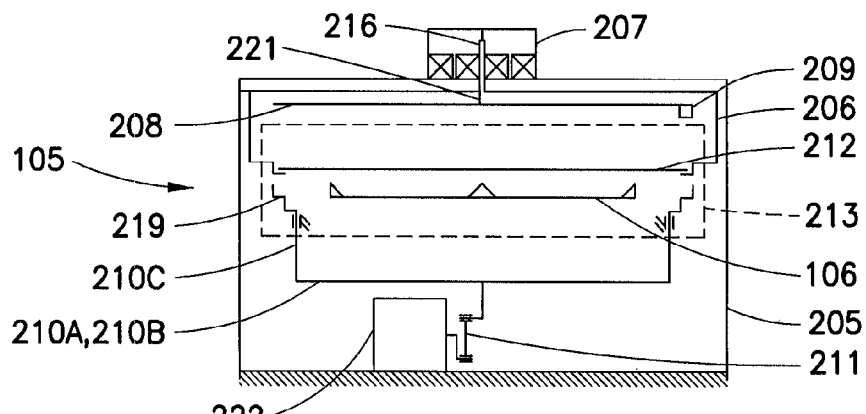
FIG. 2B is another schematic side view of the substrate aligning apparatus of the processing apparatus in FIG. 1 showing the apparatus in a second configuration.
Figure 2C:
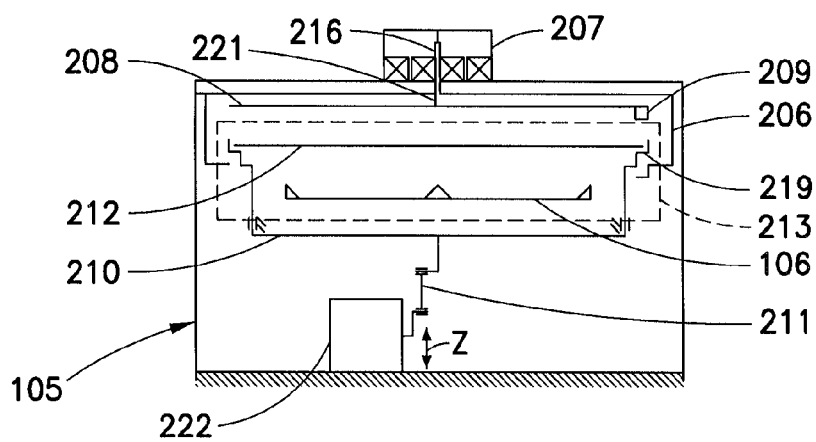
FIG. 2C is still another schematic side view of the substrate aligning apparatus of the processing apparatus in FIG. 1 showing the apparatus in a third configuration.

Referring now to FIGS. 2A-2C, in a first exemplary embodiment the substrate aligner apparatus 105 generally comprises a frame 205, an inverted chuck 206, an inverted chuck drive section 216 and drive system 207, a sensing device 209, a substrate transfer mechanism 210, and a transfer mechanism drive section 211 and drive system 222. In the exemplary embodiment shown in FIGS. 2A-2C, the frame 205 may have an opening, aperture or slot 213. Substrate transporter 103 (See FIG. 1) transports a substrate 212 (held on the transport end effector 106) into and out of the frame 205. Opening 213 thus allows the end effector 106 access to the substrate aligner apparatus 105.

Figure 3:
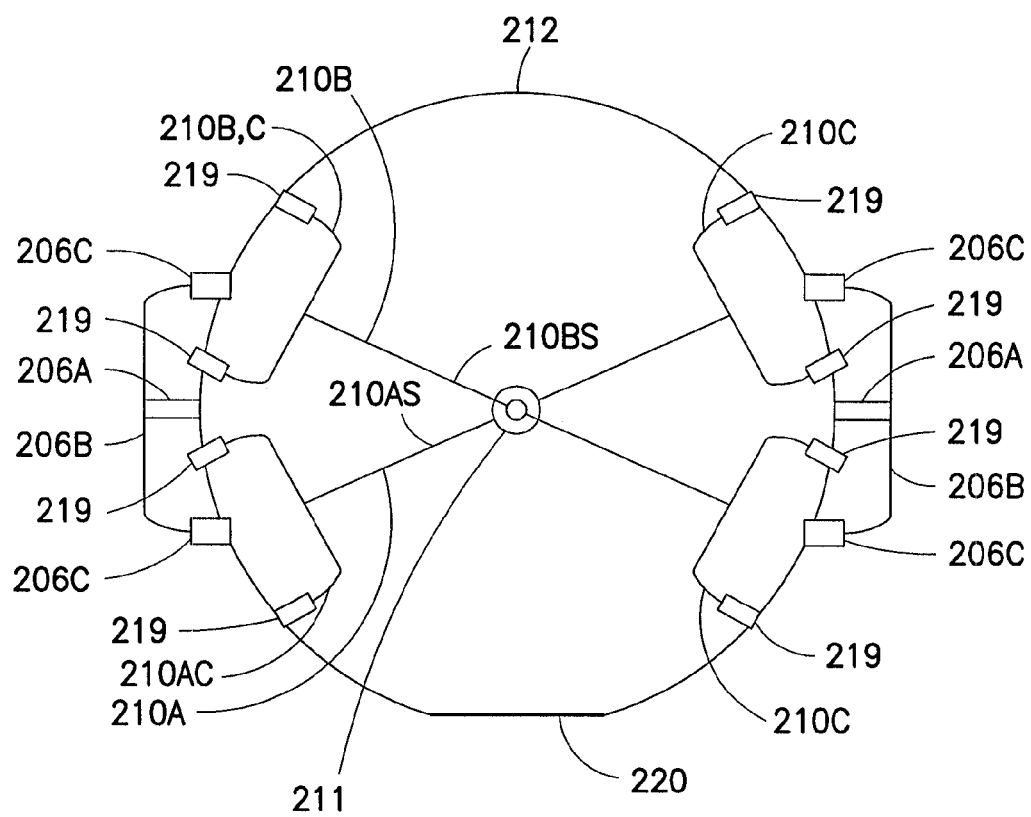
FIG. 3 is a schematic bottom view of an inverted chuck and substrate transfer mechanism of the substrate aligner apparatus in FIGS. 2A-2C.

In this exemplary embodiment, the inverted chuck 206 may be located proximate to the top 205A of frame 205. As shown in FIGS. 2A and 3, which respectively show a side view and bottom view of the substrate 212 and chuck 206, the chuck may have a span member 206A and downward extensions 206B depending therefrom. As shown best in FIGS. 2A-2C, the span member 206A and downward extensions 206B are looped above the substrate 212 and transporter end effector 106 when located within the frame 205. The span member 206A mates the chuck 206 to the drive section 216 of drive system 207 as will be described below. The span member 206A faces the top side of the substrate 212 while the downward extension members 206B extend downward from the span member 206A. Each downward extension member 206B has rest pads 206C for supporting substrate 212 when held by the chuck 206. Each extension member 206B extends down sufficiently from the span member 206A so that the rest pads 206C thereon are positioned to contact the peripheral edge of substrate 212 along the bottom side of the substrate 212 when the chuck 206 holds substrate 212. Thus, the downward extension members 206B reach around opposite sides of the substrate 212 from the span member 206A, from above the substrate, to engage the bottom region of the peripheral edge of the substrate 212. Hence chuck 206 is referred to herein as an inverted chuck. The rest pads 206C may be passive rest pads or alternatively, rest pads 206C may actively grip the substrate 212. In alternate embodiments the chuck may have any other suitable configuration.

The inverted chuck drive system 207, in this embodiment, is a rotary drive system located at the top 205A of the frame 205 and is mated with the inverted chuck 206 through drive section 216. Examples of motors that may be used in drive system 207 include stepper motors and servo motors. The motors may be brushless and may have an encoder to coordinate the alignment of substrate 212 with a signal transmitted by an optical sensor 209 corresponding to the detection of the wafer fiducial 220. The chuck drive system 207 is independent from the substrate transfer mechanism drive system 222. In alternate embodiments the chuck drive system 207 may be any other suitable configuration.

As seen in FIG. 2A, the substrate aligner apparatus 105 has a contamination shield 208. The contamination shield 208 is located near the top 205A of frame 205, between the drive section 216 of drive system 207, as well as the rotatable span portion 206A over the substrate, and the substrate 212 when the substrate is held by chuck 206. The shield 208 may be generally flat in shape and of a diameter such that it fits within the chuck 206, yet shields the entire substrate, when the chuck 206 is holding a 200 mm or 300 mm substrate 212. The shield may be fixed relative to the frame 205. As seen in FIG. 2A-2C, in this embodiment the shield 208 is attached to the frame so as not to interfere with rotation of the inverted chuck 206. In this embodiment, the shield 208 may be supported from a post 221 extending concentrically through the drive shaft 216 driving chuck 206. The shield may be made of any suitable material such as metal or plastic and may have any desired planform shape, such as substantially circular. In alternate embodiments the shield 208 may be of any other suitable configuration.

As shown in FIGS. 2A-2C, the aligner 105 has a sensing device 209 for detecting the substrate fiducial 220. In this embodiment the sensing device 209 is a reflective optical sensor. In alternate embodiments the sensor 209 may be any other suitable sensing device including capacitive and inductive sensors. In this embodiment, sensing device 209 may be mounted on contamination shield 208. In alternate embodiments the sensor 209 may be mounted in any other suitable manner so that the substrate 212, when held by the chuck 206, is in the sensing field of the sensor 209 and rotation of the inverted chuck 206 is unrestrained by the sensor 209 and its mount. Sensor 209 is positioned radially from the center of the chuck's 206 axis of rotation so that the peripheral edge of substrate 212 and its fiducial 220 are disposed in registry with the sensor 209 and so that the rotating chuck structure does not obstruct the sensing of the fiducial 220. Sensing device 209 may also be fixed from movement relative to the frame 205. In alternate embodiments the sensing device may have any other desired configuration.

Still referring to FIGS. 2A-2C and FIG. 3, the substrate transfer mechanism 210 of this embodiment is located under the chuck 206 in order to pick substrate 212 from the chuck and place the substrate 212 on the end effector 106. In this embodiment the transfer mechanism 210 may have multiple independently actuated lifters. Two lifters 210A, 210B are shown in FIG. 3 (In FIGS. 2A-2C, only one of the lifters 210A, 210B is shown for illustrative purposes). In alternate embodiments, the transfer mechanism 210 may have any number of lifters. In this embodiment, each of the two lifters are similar in configuration and have span members 210AS, 210BS and upward extensions 210AC, 210BC depending from opposite ends of the lifter span members 210AS, 210BS. The span members 210AS, 210BS mate the lifters 210A, 210B with the substrate transfer mechanism drive section 211 of the drive system 222 as described below. The span members 210AS, 210BS face the bottom of the substrate 212 when substrate 212 is held by chuck 206 while each of the upward extensions 210C extend up towards the bottom of substrate 212 when substrate 212 is held by chuck 206. Each of the upward extensions 210C has rest pads 219 for supporting substrate 212. Each rest pad 219 contacts the bottom peripheral edge of substrate 212. In alternate embodiments the substrate transfer mechanism 210 may have any other suitable configuration.

The substrate transfer mechanism drive system 222 is located at the bottom 205B of the frame 205. The drive system 222 is mated to the transfer mechanism 210 through drive section 211. In this exemplary embodiment, drive system 222 is a linear drive system capable of independently moving each lifter 210A, 210B back and forth along drive Axis Z (See FIGS. 2A-2C). Drive system 222 may for example be a ball-screw drive, a rod linear actuator or a slide linear actuator. In alternate embodiments drive system 222 may be of any other suitable configuration or drive type. The linear travel of the drive system 222 is sufficient for either lifter 210A, 210B to lift substrate 212 off chuck 206 when substrate 212 is held by chuck 206 and lower it onto end effector 106.

Figure 7:
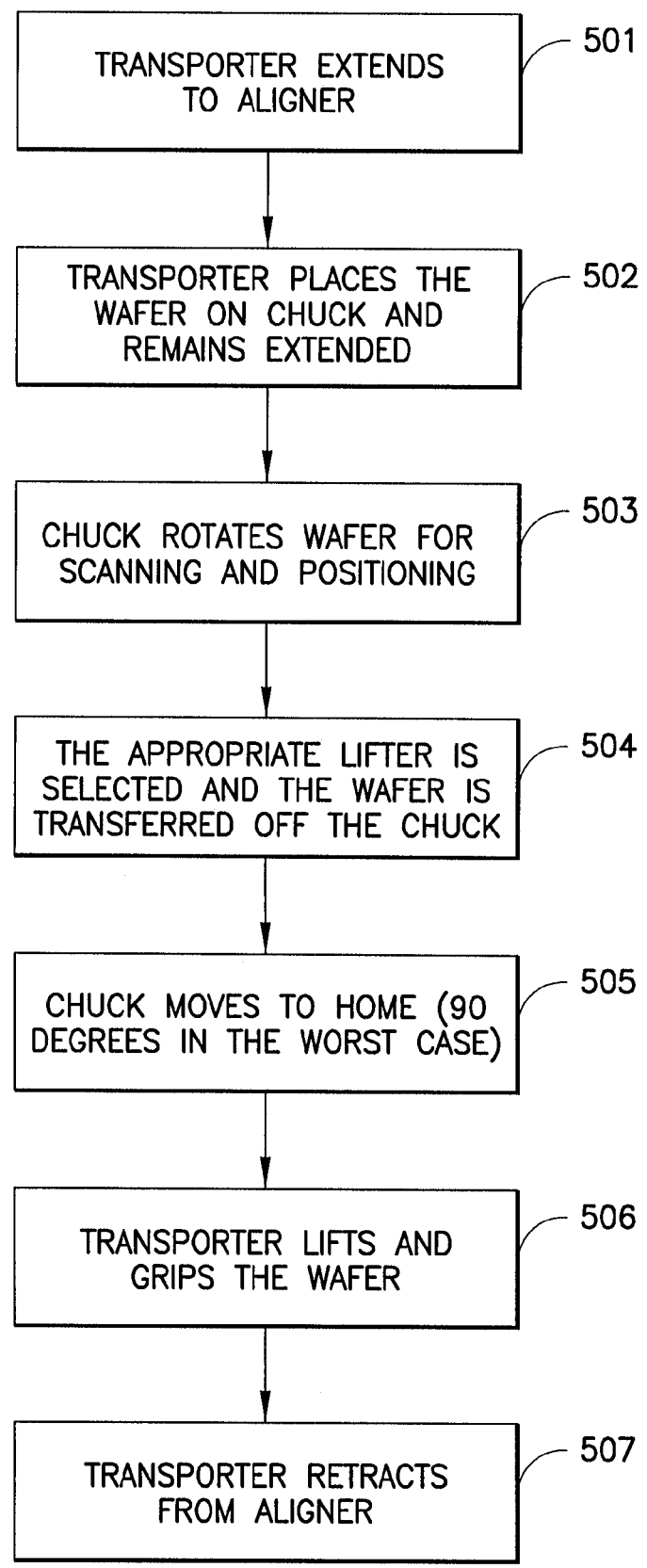
FIG. 7 is a flow chart showing a method for aligning a substrate in accordance with the aligner apparatus in FIGS. 2A-2C and FIG. 3.

Referring again to FIGS. 2A-2C and 3 and also referring to the flow chart in FIG. 7, the operation of substrate aligner apparatus 105 will be described. As indicated in Block 501 of FIG. 7, the substrate transporter end effector 106 enters the aligner above the chuck rest pads 206C through the opening in the frame 213 and places the substrate within the chuck 206 (See FIG. 2A). The end effector moves down below the chuck 206 thereby placing the substrate 212 onto the inverted chuck rest pads 206C, (See Block 502 of FIG. 7 and FIG. 2B). The end effector 106 if desired may remain extended between the inverted chuck 206 and transfer mechanism lifters 210A, 210B. The substrate transporter end effector 106 is able to remain within the frame 205 during alignment due to the configuration of the chuck 206 and transfer mechanism 210 as shown in FIGS. 2A-2C. The inverted chuck 206 grips the substrate 212 positioned thereon for alignment. The inverted chuck 206 is rotated, via the inverted chuck drive section 216 and drive system 207 (See Block 503 of FIG. 7). During rotation, the sensing device 209 senses the peripheral edge of the substrate 212 and detects the substrate alignment feature (fiducial) 220 on the edge of the substrate 212 as may be realized. During alignment the contamination shield 208 prevents any particles generated by the chuck 206 and chuck drive system 207, 216 from contaminating the surface of the substrate 212.

Sensing device 209 is able to detect the substrate fiducial 220 independent of its orientation relative to the gripping pads of chuck 206. For example, the chuck rest pads 206C grip the edge of the substrate 212, without masking the edge of its fiducial 220 and hence the fiducial 220 and wafer edge are always substantially exposed to sensing device 209. In addition, as noted before, sensing device 209 is capable of detecting the fiducial 220 from but one side (e.g. the top) of the substrate 212 so that obstructions or cover on the opposite side of the wafer does not degrade sensor performance. Detection of the substrate edge and fiducial 220 independent of position on the chuck 206 eliminates substrate placement re-tries on the chuck 206.

Once the sensing device 209 detects the substrate fiducial 220, a suitable indication signal is transmitted to a controller (not shown) to register the position of the substrate fiducial 220 relative to a desired reference frame. The sensing device 209 may also send suitable signals to the controller enabling the controller to determine substrate eccentricity with respect to a desired substrate center reference location. The controller may calculate chuck movement to achieve desired alignment orientation of the substrate 212 and send movement commands to drive 207. The inverted chuck 206 positions the substrate 212 to a desired alignment orientation (See Block 503 of FIG. 7). The appropriate lifting pad 210A, 210B is then selected to lift the post aligned substrate 212 off of the inverted chuck 206 (See Block 504 of FIG. 7). The lifting pads 210A, 210B are independently actuated and because of their configuration (See FIG. 3), at least one of the lifting pads 210A, 210B is capable of clearing obstructions from end effector structure and chuck structure regardless of chuck 206 orientation post substrate positioning to pick the post positioned substrate 212 from the chuck 206. Thus, transfer mechanism 210 can access the inverted chuck independent of the position of the substrate transporter end effector 106 within the aligner frame 205 and without rotationally repositioning the substrate 212 on the chuck 206. The lifting pads 210A, 210B lift the substrate 212 from the inverted chuck 206 and the inverted chuck 206 may return to its home position (See Blocks 504-505 of FIG. 7). The substrate transporter end effector 106 picks the substrate off the lifting pad 210A, 210B, grips the wafer (substrate) 212 and delivers the substrate 212 to be processed further (See Blocks 506-507 of FIG. 7). It is noted that the controller may position the end effector 106 so that picking the substrate from the lifting pads 210A, 210B also effects correction of eccentricity misalignment. Table 2 below summarizes the exemplary process described above (as graphically depicted in FIG. 7) and illustrates at a glance the improved efficiencies provided over conventional aligners. Table 2 also identifies exemplary times corresponding to each of the operations performed to align a substrate using this exemplary embodiment.

TABLE 2

| Pass Number | Description | Estimated Time (sec) |
| --- | --- | --- |
| 1 | Transporter extends to aligner | 1.0 |
| 2 | Transporter places the wafer on chuck and remains extended | 0.8 |
| 3 | Aligner scans and post positions wafer | 1.5 |
| 4 | The appropriate set of pads is selected and the wafer is lifted | 0.5 |
| 5 | Chuck moves to home (90 degrees in the worst case) | 0.2 |
| 6 | Transporter lifts and grips the wafer | 0.8 |
| 7 | Transporter retracts to home | 1.0 |
| Total time | | 5.8 |

As can be seen by comparison to Table 1, the aligner 105 in the exemplary embodiment shown in FIGS. 2A-3 and FIG. 7 is capable of significantly reducing the alignment time to align a substrate over the at least eleven second alignment time of the prior art as described in the background section above.

Figure 4:
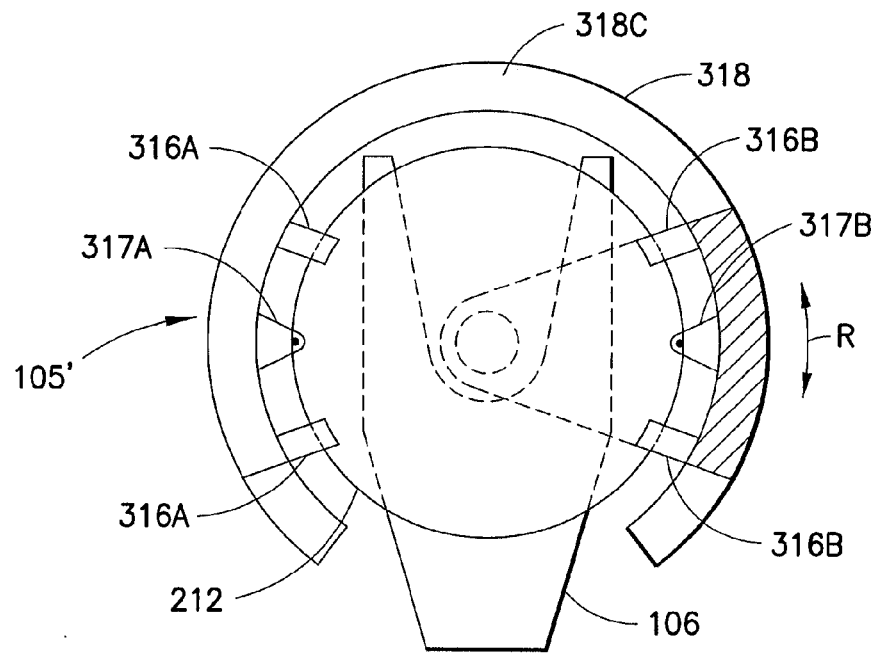
FIG. 4 is a schematic top view of a substrate aligner apparatus in accordance with another exemplary embodiment of the present invention.
Figure 5:
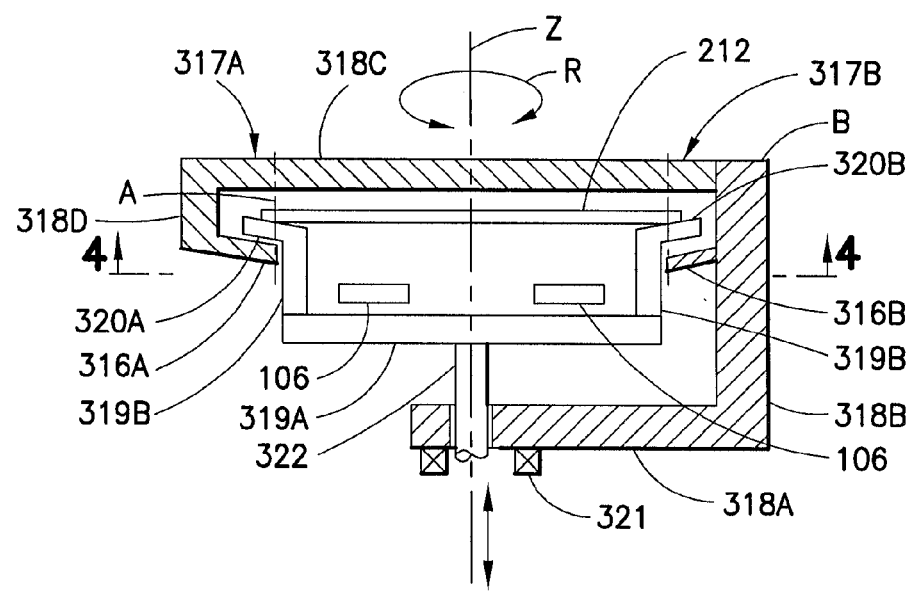
FIG. 5 is a side view of the substrate aligner apparatus in FIG. 4.

Referring now to FIGS. 4 and 5, in a second exemplary embodiment the substrate aligner apparatus 105' generally comprises a frame (not shown), a rotatable sensor head 318 with at least one sensing device 317, and a substrate support 319. The frame (not shown) is similar to the frame 205 (See FIGS. 2A-2C) in the first embodiment of the substrate aligner apparatus 105 described before unless otherwise noted. The rotatable sensor head 318 has a base member 318A located, for example, towards the bottom of the frame and below the end effector 106 when the end effector 106 is inside the frame. The end effector 106 may access the frame through an opening similar to opening 213 in FIGS. 2A-2C. The base member 318A is connected to a drive section 321 of the sensor head drive system (not shown) as will be described below. The base member 318A extends radially from the rotatable sensor head's 318 axis of rotation, Axis Z, as shown in FIG. 5. Base member 318A has a base extension member 318B depending therefrom on but one side of the base member 318A in this embodiment. The base extension member 318B extends upward toward the top of the frame from base member 318A above the substrate 212 when held by the substrate support 319. Base extension member 318B has a span member 318C depending therefrom. Span member 318C may be arcuate in shape and extends above substrate 212 to the opposite side from the base extension member 318B. As seen best in FIG. 4, the arcuate shape of span member 318C leaves a distance between the perimeter of the substrate 212 and span member 318C so that the span member 318C does not overhang the substrate 212. In alternate embodiments the span member 318C may have any other desired shape. As seen in FIG. 5, the span member 318C has a downward extension member 318D depending therefrom on the side opposite the base extension member 318B. Thus, as best shown in FIG. 5 the base extension member 318B, the span member 318C and the downward extension member 318D wrap around the substrate support system 319 and the substrate 212 from the base member 318A. In this exemplary embodiment the rotatable sensor head 318 also has substrate supports 316A, 316B located on opposite sides of the sensor head 318. Substrate supports 316A depend from the downward extension member 318D while substrate supports 316B depend from the base extension member 318B as shown in FIGS. 4 and 5. Substrate supports 316A, 316B wrap around the underside of substrate 212 from the downward extension member 318D and the base extension member 318B so that the substrate supports 316A, 316B contact the bottom peripheral edge of substrate 212 when substrate 212 is held by the sensor head 318 as will be described below. The substrate supports 316A, 316B may be passive or active gripping. In alternate embodiments the rotatable sensor head 318 may have any other desired configuration.

In this exemplary embodiment, sensor head 318 may have two sensing devices 317A, 317B located on opposite sides of sensor head 318 as shown in FIGS. 4 and 5. In alternate embodiments the sensor head 318 may have more or less than two sensors. Sensing devices 317A, 317B may be reflective optical sensors or through beam optical sensors. In alternate embodiments the sensing devices 317A, 317B may be capacitive or inductive sensing devices. Sensors 317A, 317B are radially positioned from the center of rotation, Axis Z, a sufficient distance so that the sensors 317A, 317B are capable of sensing the peripheral edge of substrate 212.

The sensor head drive system (not shown) is mated to the sensor head through drive section 321 and is similar to the rotary drive described before with respect to aligner 105. However, in this embodiment the drive system is located at the bottom of the frame and rotates the sensor head around Axis Z as shown in FIG. 5. In alternate embodiments the drive system may be of any other desired configuration.

As seen in FIG. 5, the substrate support system 319 in this exemplary embodiment is nested between the sensor head span member 318C and the sensor head base member 318A. The substrate support system has a span member 319A whose center is located substantially coincident with Axis Z and mated to a substrate support drive member 322, also located along Axis Z. Substrate support drive member 322 is part of the substrate support drive system (not shown) as described below. In this embodiment, the span member 319A has two upward extension members 319B depending on opposite sides therefrom. In alternate embodiments there may be any number of upward extension members depending from the span member 319A. The span member 319A faces the bottom of the substrate 212 when held by the support 319. The upward extension members 319B have rest pads 320A, 320B that overlap at least in part the sensor head devices 317A, 317B of sensor head 318 (See FIG. 5). The substrate support rest pads 320A, 320B are configured to support the bottom peripheral edge of substrate 212. Rest pads 320A, 320B may actively or passively grip substrate 212. Rest pads 320A, 320B or at least a portion thereof in way of sensor devices 317A, 317B may also be made of a transparent material so that a beam A,B of radiation from sensors 317A, 317B, capable of detecting the edge of the substrate 212 when seated on rest pads 320A, 320B, passes through the portion of the rest pads 320A, 320B in way of beam A,B to the sensor receiver (not shown) so as to be able to detect the edge of the substrate 212 and the fiducial 220 on the edge. The material for the rest pads 320A, 320B may for example be quartz, optically transparent to light beams, or any other suitable material. In alternate embodiments, when a sensor such as a reflective sensor is used, the rest pads 320A, 320B may be of a non-transparent material. In alternate embodiments, the substrate support system 319 may have any other desired configuration.

The substrate support drive system (not shown) is similar to the linear drive system 211, 222 described before and shown in FIGS. 2A-2C, unless otherwise noted. The substrate support drive system mates with the substrate support system 319 through the substrate support drive member 322. The substrate support drive system in this embodiment transfers the substrate 212 back and forth along Axis Z. The drive system is capable of moving the support system 319 from a position where the rest pads 320A, 320B are located above sensor head rest pads 316A, 316B (See FIG. 5) to a position where the rest pads 320A, 320B are below sensor head rest pads 316A, 316B. In this embodiment the substrate support system is not capable of rotation but in alternate embodiments the substrate support drive system may be combined with a rotational drive so that the substrate support system not only travels along Axis Z but rotates about Axis Z as well.

Figure 8:
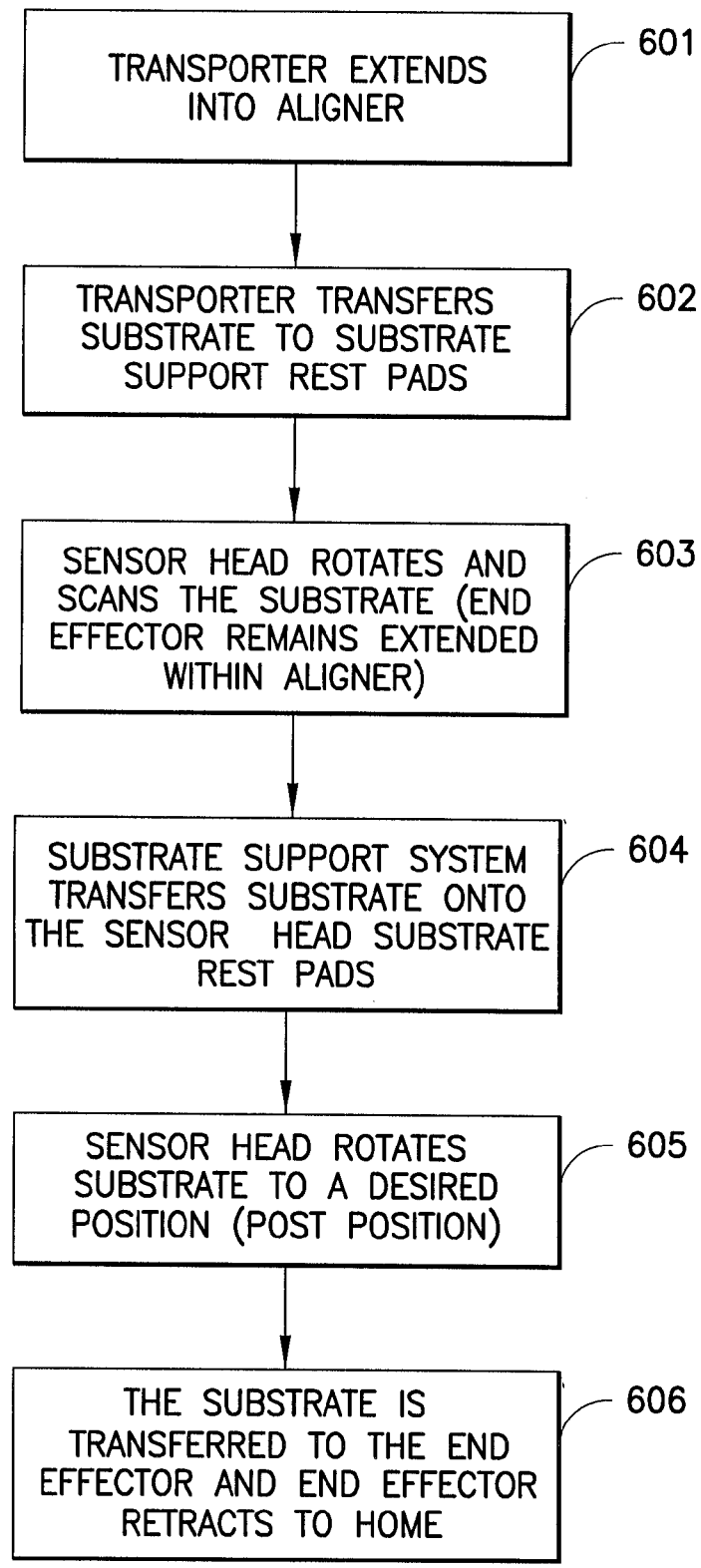
FIG. 8 is a flow chart showing a method for aligning a substrate in accordance with the aligner apparatus in FIGS. 4 and 5.

Still referring to FIGS. 4 and 5 and also referring to the flow chart in FIG. 8, the operation of the substrate aligner apparatus 105' will be described. The substrate transporter end effector 106 enters the aligner between the sensor head span member 318C and sensor head substrate supports 316A, 316B through the opening in the frame (similar to opening 213 in FIG. 2A) (See Block 601 in FIG. 8) and places the substrate on the support pads 320A, 320B of support system 319 about Axis Z. The substrate support system 319 may move up along Axis Z to the position shown in FIG. 5 to enable the end effector 106 to place substrate 212 onto the substrate support rest pads 320A, 320B (See Block 602 in FIG. 8). The end effector 106 may move down along Axis Z, to a position below support pads 320A, 320B and above the support system span member 319A so that its location is within substrate support 319 as best shown in FIG. 5. The end effector 106 may remain extended under the substrate 212. As noted in Block 603 of FIG. 8, in order to scan the substrate 212, the rotatable sensor head 318 is rotated more than one-hundred and eighty degrees, either clockwise or counter clockwise (as indicated by arrows R in FIG. 4, so that the entire peripheral edge of substrate 212 is scanned by sensing devices 317A, 317B. This will allow one of the two sensing devices 317A, 317B to detect the substrate fiducial 220 (FIG. 3). The fiducial 220 can be detected by the sensing devices 317A, 317B independent of the fiducial 220 location relative to the support pads 320A, 320B of substrate support 319. For example, when sensing devices 317A, 317B are through beam sensors, the fiducial 220 is not masked from the sensor beam because substrate supports 320A, 320B, at least in way of the beam, are transparent to the sensor beam thereby allowing the beam to pass through the support pads 320A, 320B and impinge on the substrate edge to enable sensors 317A, 317B to sense the fiducial.

Upon detecting the substrate alignment feature 220, a suitable indication signal is transmitted from the sensor to a controller (not shown) to register the detection of the substrate alignment feature 220. The substrate 212 is lowered by substrate support 319 onto the sensor head substrate rest pads 316A, 316B thereby transferring the substrate 212 from the substrate support 319 to the rotatable sensor head 318 (See Block 604 in FIG. 8). The end effector 106 may remain below the sensor head rest pads 316A, 316B. The rotatable sensor head 318 rotates substrate 212 to a desired alignment orientation in accordance with instruction from the controller (See Block 605 in FIG. 8). As may be realized, the rotation of the sensor head 318 is significantly faster during the scanning operation in Block 603 of FIG. 8 than it is in the substrate orientation operation in Block 605 of FIG. 8. The increased rotational speed of the sensor head 318 is accomplished, for example, where the sensor head drive system is a multiple speed rotary drive such as multiple speed stepper motor. In alternate embodiments, any suitable drive system may be used. The substrate transporter end effector 106 lifts the substrate 212 off the sensor head rest pads 316A, 316B, grips the substrate 212 and delivers the substrate 212 to be processed further (See Block 606 in FIG. 8). If there is interference between the sensor head support pads 316A, 316B and the end effector 106 when substrate 212 is held by sensor head 318 at its post alignment position so that the end effector 106 pick path is obstructed, the substrate support system 319 can lift substrate 212 from the sensor head support pads 316A, 316B. Support system 319 has rest pads 320A, 320B that are positioned to clear the sensor head support pads 316A, 316B in the event that the sensor head support pads 316A, 316B block the pick path of the end effector. Further, as seen in FIG. 5, the support system rest pads 320A, 320B are positioned as to not interfere or obstruct end effector 106 motion along Axis Z. Accordingly, transfer of the substrate 212, post positioning, to the end effector may be accomplished independent of substrate orientation and without rotational repositioning of the substrate. The sensor head moves to its home position.

Figure 6:
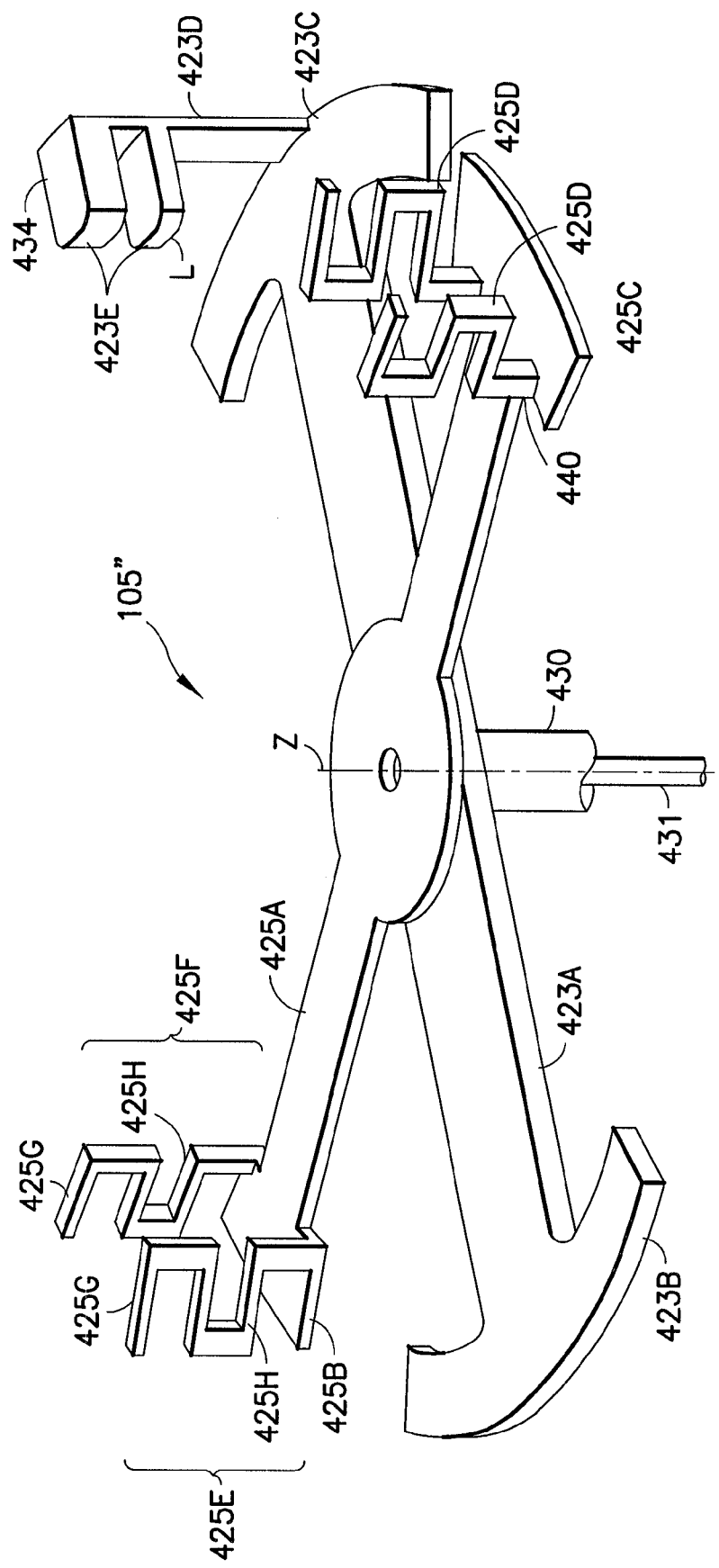
FIG. 6 is a perspective view of a substrate aligner apparatus in accordance with yet another exemplary embodiment of the present invention.

Referring now to FIG. 6, there is shown a perspective view of a substrate aligner apparatus 105" in accordance with another exemplary embodiment. In this embodiment, the substrate aligner apparatus generally comprises a frame (not shown), a rotatable sensor head 423 with sensing device 424 and a rotatable chuck 425 having a buffer system 440 for buffering substrates. The frame in this exemplary embodiment is similar to frame 205 described before and shown in FIGS. 2A-2C unless otherwise noted.

In the embodiment shown in FIG. 6, the rotatable sensor head 423 may be rotatable about Axis Z. The sensor head 423 has a base section 423A mated with a sensor head drive section (of which only a portion of shaft 430 is shown in FIG. 6). The sensor head drive shaft 430 is connected to a sensor head drive system (not shown) as described below. In this embodiment, base member 423A has arms 423B, 423C extending radially from its center of rotation disposed at Axis Z. Base member 423A has an upward extension member 423D depending from one arm 423C of base member 423A. In alternate embodiments both arms may have upward extension members depending therefrom. The upward extension member 423D has cantilever members 423E depending from the upward extension member 423D for supporting the sensing device 424. In this embodiment, the sensing device 424 may be a through beam optical sensor having, for example, a beam transmitter and a beam detector on the cantilevered member 423E. In alternate embodiments, the sensing device may also be a reflective sensor, a capacitive sensor or an inductive sensor. The sensing device 424 is positioned radially from Axis Z at a distance that enables the sensing device 424 to scan the peripheral edge of substrate 212 and detect the fiducial when substrate 212 is held by the substrate buffering system 425. In this embodiment there is only one sensing device 424 but in alternate embodiments there could be any number of sensing devices. As noted before, the sensor head drive system (not shown) mates with the rotatable sensor head base member 423A through drive shaft 430. The sensor head drive system may be similar to the rotational drive systems in aligners 105, 105' as described before, but with motors for independent rotation of co-axial shafts 430, 431. The sensor head drive system may be located at any suitable location on the frame and provides rotation about Axis Z.

In the exemplary embodiment shown in FIG. 6, chuck 425 is rotatable about Axis Z. The chuck 425 has a base member 425A that is substantially centered with Axis Z and is mated to a chuck drive of which only a portion of shaft 431 is shown in FIG. 6. The drive shaft 431 is co-axial with shaft 430 and rotates about Axis Z. As noted before, the drive section is capable of independent rotation of shafts 430, 431. The base member 425A has arms 425B, 425C extending radially from the center of rotation, Axis Z. Each arm 425B, 425C has a rest pad system 425D depending upwardly therefrom. In this embodiment, each rest pad system 425D has two rest pad extension members 425E, 425F. In alternate embodiments, there may be any number of rest pad extension members. Each rest pad extension member 425E, 425F has a generally stepped shape with horizontal sections 425G, 425H forming rest pads. One set of rest pads 425G form support for substrate 212 being scanned while the other set of rest pads 425H forms buffer 440. In alternate embodiments there may be any number of buffers used. The rest pads 425G, 425H can be active or passive gripping and may be made of transparent or non-transparent material depending on the sensing device being used as described before with reference to pads 320A, 320B shown in FIG. 5. By way of example, in this embodiment, rest pads 425G, 425H may be made of quartz or other suitable material transparent to light beam L generated by sensor 424. The rest pads 425G, 425H are at a radial distance from Axis Z, sufficient to hold substrate 212 on its bottom peripheral edge while at the same time allowing the edge of substrate 212 to be scanned by the sensing device 424. The rest pads 425G, 425H and the cantilever members 423E of the sensor head are vertically spaced to allow a substrate transporter end effector 106 to access the rest pads 425G in order to pick or place a substrate on the rest pads. The rest pad extension members 425D do not rotationally interfere with the cantilever members 423E. Rest pads 425G are positioned to pass between cantilever members 423E. Rest pads 425H are positioned to pass under the lower most cantilever member 423E.

Figure 9:
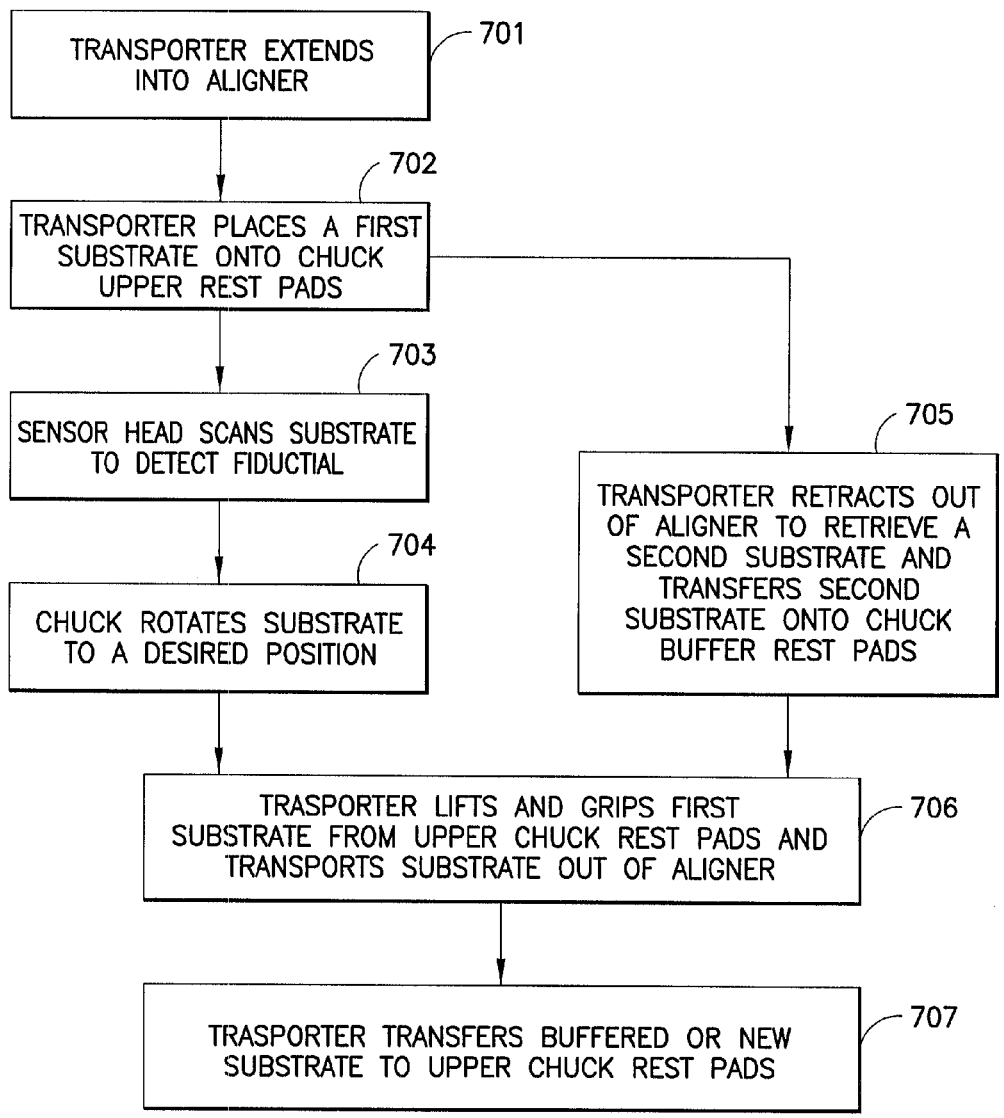
FIG. 9 is a flow chart showing a method for aligning a substrate in accordance with the aligner apparatus in FIG. 6.

Referring still to FIG. 6 and the flow chart in FIG. 9, an exemplary operation manner of the substrate aligner apparatus 105" will be described. A substrate transporter with a single end effector such as those described in U.S. Pat. No. 5,765,983 and U.S. Pat. No. 5,577,879, both of which are incorporated herein by reference in their entirety, may be used with this exemplary embodiment. The substrate transporter end effector 106 (FIG. 1) enters the aligner above the chuck or buffering system rest pads 425G through the frame opening (similar to opening 213 shown in FIG. 2A) and places a first substrate, similar to substrate 212, onto rest pads 425G (See Blocks 701, 702 in FIG. 9). The empty end effector/substrate transporter may retract out of the aligner. It is noted that movements of the empty end effector may be conducted at greater speed than when holding a substrate. If desired, the end effector/substrate transporter may retrieve a second substrate for alignment (See block 705 in FIG. 9). In this embodiment the upper rest pads 425G form scanning rest pads while lower rest pads 425H form buffer rest pads. If desired, in parallel with the transporter retrieving a second substrate, the rotatable sensor head 423, in Block 703 of FIG. 9, is rotated by the sensor head drive shaft 430 to allow the sensing device 424 to detect the fiducial of the first substrate placed on the upper pads 425G.

Sensing device 424 can detect the fiducial independent of its placement on the chuck pads 425G. For example, even if the fiducial is resting on one of the rest pads 425G, the transparent material of the rest pads in way of the sensor through beam leaves the fiducial unmasked or sensable to the beam of the sensor 424. Also, the rest pads 425G grip the substrate on its edges leaving the upper surface of the substrate exposed, allowing, in an embodiment where the sensor is a reflective, capacitive or inductive sensor, fiducial detection without any obstruction from the chuck 425 structure.

When the sensing device 424 detects the substrate alignment feature, a suitable indication signal is transmitted to a controller (not shown) to register the detection of the substrate alignment feature. The chuck 425 then rotates the substrate to a desired alignment orientation (See Block 704 in FIG. 9). As may be realized, rotation of the sensor head 423 to scan the substrate and detect the fiducial may be performed at a much higher rate of rotation than chuck rotation to position the substrate. If desired, The substrate transporter/end effector 106 may enter the frame (See Block 705 in FIG. 9) in the same manner described above at a position above the buffer rest pads 425H to buffer a second substrate on rest pads 425H. The transporter moves an empty end effector (that may be the same end effector having buffered the second substrate or another empty end effector) up to a position between the first and second substrates as they are held in the chuck 425. The end effector moves to a location under the first substrate held on pads 425G and picks the positioned substrate from pads 425G for further processing (See Block 706 in FIG. 9). In block 707 of FIG. 9, the substrate on the buffer pads 425H, or a new substrate if desired, may be placed on the upper pads 425G of the chuck 425. In alternate embodiments the rest pad extension members 425D may be movable to allow vertical movement of the end effector when transferring the buffered substrate to the upper rest pads without the end effector partially retracting out of the aligner. After placement of the second substrate onto pads 425G, the process in Blocks 703-704 is repeated. As may be realized, the buffer on chuck 425 increases the efficiency of the aligner by minimizing transfer times for loading the aligner.

Figure 10A:
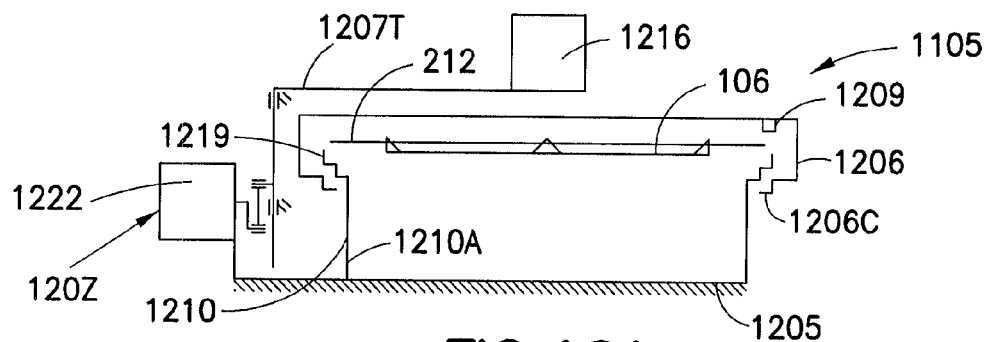
FIGS. 10A-10C are schematic elevation views respectively showing an aligning apparatus, in accordance with still yet another embodiment, in three different positions.
Figure 10B:
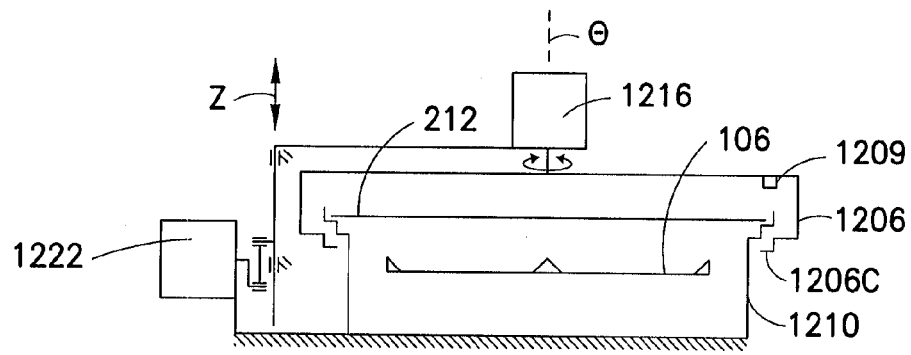
Figure 10C:
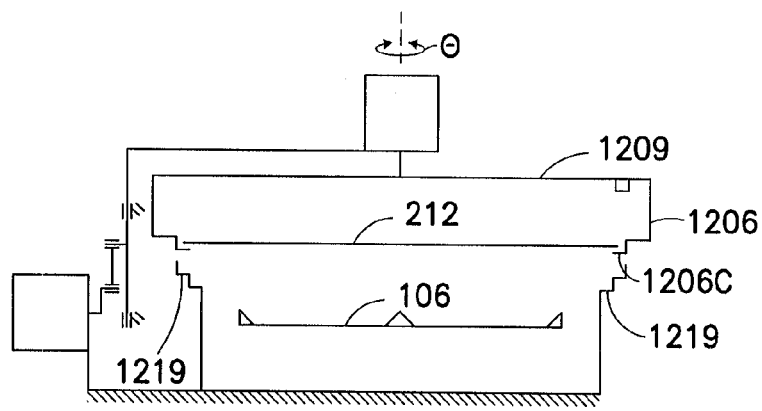

Referring now to FIGS. 10A-10C, there is shown another substrate aligner apparatus 1105 in accordance with still yet another exemplary embodiment. The aligner apparatus 1105 is respectively shown in FIGS. 10A-10C in three different positions. The aligner apparatus 1105 in this exemplary embodiment is generally similar to the aligner apparatus 105 described before and shown in FIGS. 2A-2C, except as otherwise noted. Similar features are thus similarly numbered. Aligner apparatus 1105 has a movable chuck 1206, a sensing device 1209 and a substrate transfer system 1210. The aligner 1105 also has a drive system 1207 powering the movements of the movable chuck 1206. The transfer system 1210 is configured for holding the substrate 2112 in a fixed position inside the aligner. In this embodiment, the substrate transfer system 1210 has members 1210A that are fixed to the aligner frame 1205 in any suitable manner or position. The transfer system members 1210A may have any suitable configuration, and are provided with substrate rest pads 1219 (similar to rest pads 219 shown in FIG. 3). Rest pads 1219, in this embodiment, are not movable but may provide a substrate placement position used when scanning the substrate with sensing device 1209, as will be described further below. Movable chuck 1206, has a general inverted chuck configuration (similar to chuck 206 shown in FIG. 2A-2C). In this embodiment, chuck 1206 is movable both vertically (in the direction indicated by arrow Z in FIG. 10b) and is rotatable about axis or rotation θ. In this embodiment, the drive system 207 has rotatable drive 1216 and linear drive sections 1222 connected by a transfer member 1207T as shown in FIG. 10A. Linear drive 1222, similar to linear drive 222 shown in FIGS. 2A-2C, is operably coupled to transfer member 1207T, and is capable of traversing the transfer member 1207T in the Z direction relative to the aligner frame. The transfer member 1207T may have any suitable shape (the configuration shown in FIGS. 10A-10C is merely exemplary) and may be movably mounted to the aligner frame 1205 in any desired manner to allow relative movement between transfer member and frame in the Z direction. As seen in FIG. 10A, the movable chuck 1206 is mounted to the transfer member 1207T, and thus moves vertically (relative to the frame 1205) in unison with the transfer member. Chucking may be rotatably mounted relative to the transfer member 1207T (such as by suitable rotatable bearing or bushing system) so that chuck 1206 may rotate relative to the transfer member and the aligner frame about axis θ. Rotatable chuck 1206 is rotated about axis θ under impetus from rotational drive section 1216 coupled to the chuck 1206 by a suitable rotational drive transmission system (e.g. rotational drive shaft). In this embodiment, rotational drive section 1216 may also be borne by the movable transfer member 1207T. In alternate embodiments, the rotational drive may be mounted to the aligner frame and coupled to the rotatable chuck by a suitable transmission capable of transmitting rotation to the chuck and accommodating linear motion of the chuck relative to the aligner frame. In this embodiment, the sensing device 1209 that is similar to sensing device 209 shown in FIG. 2A-2C) is mounted on chuck 1206 as shown in FIG. 10A. Sensing device 1209 is positioned to sense the peripheral edge of substrate 212, and its fiducial, when the substrate 212 is seated on the rest pads 1219 of transfer system 1210. Sensing device 1219 is capable of detecting the fiducial 220 (see FIG. 3) of the substrate independent of the orientation of the substrate 212 and position of the fiducial relative to rest pads 1219 or any other structure of the transfer system 1210.

In this embodiment, substrate alignment may be in the following exemplary manner. Substrate 212, introduced into the aligner 1105 with end effector 106, may be positioned onto stationary transfer system rest pads 1219 (see FIGS. 10A-10B). Scanning of the substrate 212, for fiducial detection, as well as eccentricity measurements if desired, may be performed by rotating chuck 1206 (about axis θ), thereby rotating the sensor device 1209 relatively to stationary substrate and scanning the entire periphery of the substrate. As seen in FIG. 10B, in this position (i.e. the scanning position) the movable chuck 1206 has a vertical position so that the chucks substrate rest pads 1206C (similar to substrate rest pads 206C described before) are located below the rest pads 1219 of transfer system 1210 supporting the substrate 212 after location of the fiducial 220 is identified, for example as described above by detection with sensor 1209 alignment of the substrate is effected with movable chuck 1206. The chuck 1206 is moved in the Z direction to pick the substrate (from the transfer system rest pads) with the substrate 212 resting on chuck resting pads 1206, now positioned above the resting pads 219 of the transfer system (see FIG. 10C), the chuck is rotated about axis θ to place the substrate in the desired alignment. The end effector 106 may pick the aligned substrate from the rest pads 1206C of the chuck 1206. In the event the post alignment position of the chuck rest pads 1206C present an interference to a direct substrate pick by the end effector from the chuck 1206, the chuck 1206 may be moved to place the substrate on the rest pads 1219 of transfer system 1210 (similar to the position shown in FIG. 10B) the end effector picks the substrate 212 from the transfer system 1210. Thus post alignment substrate transfer to the end effector may be performed without rotational repositioning of the substrate. As seen in FIG. 10A-10C, the end effector may remain extended throughout the alignment process.

The previously described exemplary embodiments of the aligner 105, 105', 105", and 1105 have many advantages over conventional aligners. Some of the advantages of the aligners 105, 105', 105" and 1105 include but are not limited to the following; elimination of robot re-tries in placing the wafer in the aligner. The wafer may be arbitrarily oriented relative to the end effector without the chuck ever being on the pick path of the robot end effector. The wafer may be aligned properly, without robot re-tries, even for the case when the fiducial lies on top of the aligner chuck pads. As described before, the align times of the present invention are significantly shorter than the align times of conventional aligners. The wafer may always be moved by edge contact without rolling or slipping relative to the chuck, therefore yielding minimum particle generation. During the entire wafer alignment process the robot end effector may stay positioned under the aligner and substrate without any mechanical interference during the alignment process. This means that the wafer may be aligned and placed on the robot end effector with one extend and one retract motion from the aligner station. In addition, only one wafer lift is employed in order to allow the wafer to be picked at the desired post-positioning orientation. Multiple vertical moves are eliminated. This yields minimum wafer walking and optimal aligner throughput.

Figure 11:
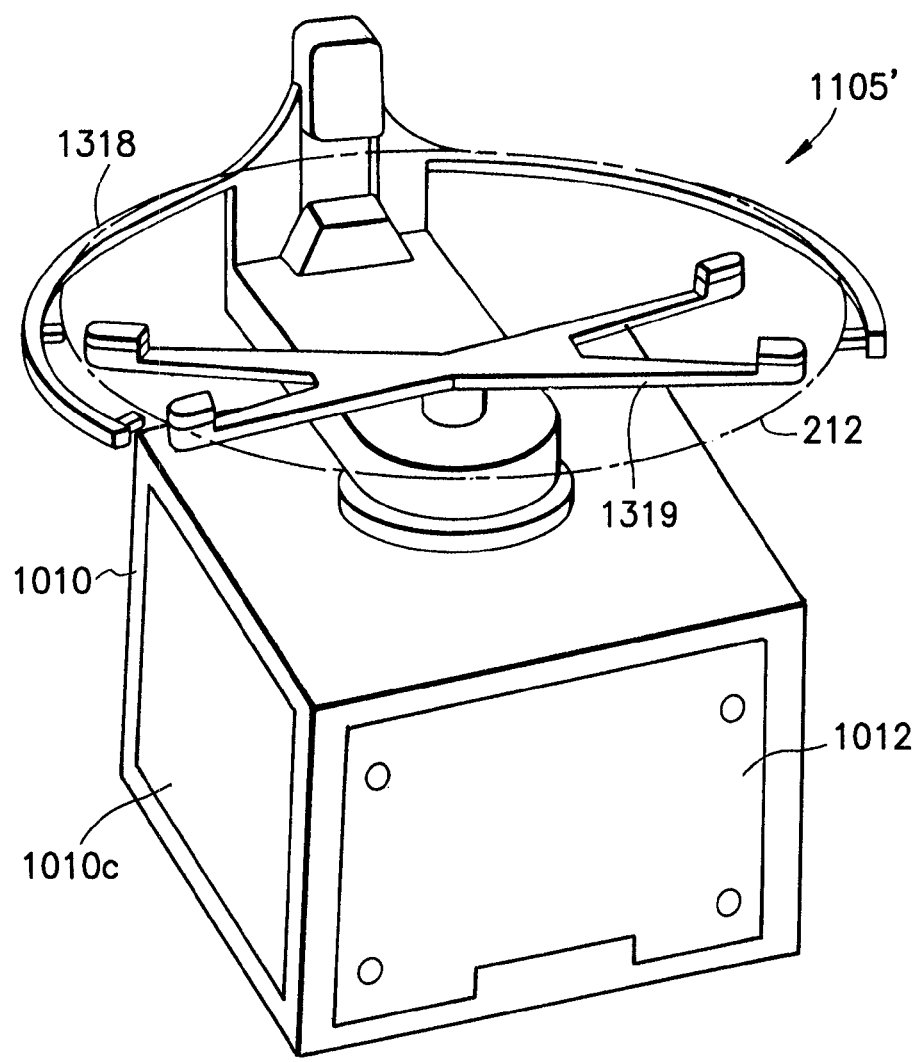
FIG. 11 is a schematic perspective view of a substrate aligner apparatus in accordance with yet another exemplary embodiment and a substrate 212.
Figure 11A:
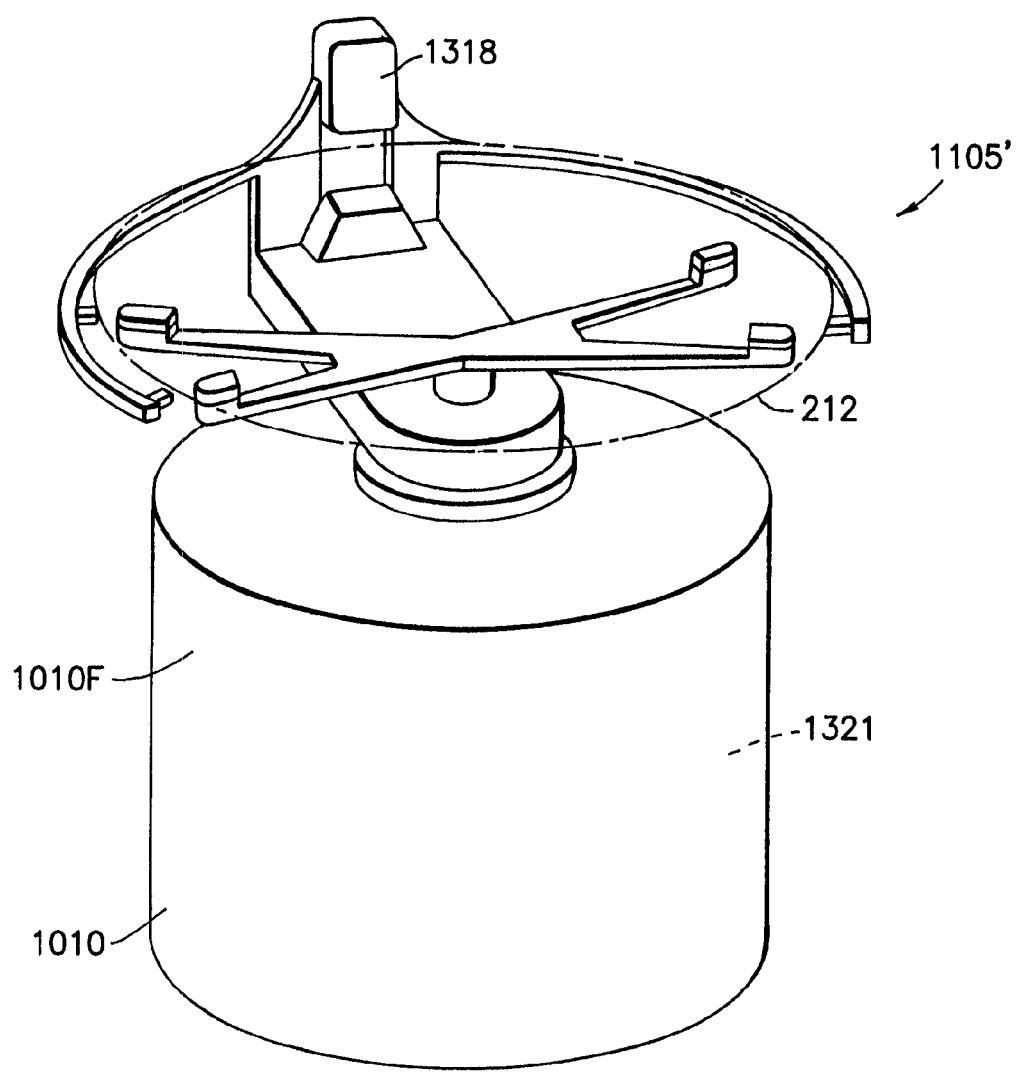
FIG. 11A is another perspective view of the substrate aligner apparatus with a casing of the apparatus removed.

Referring now to FIG. 11, there is shown a substrate aligner apparatus 1105' in accordance with yet another exemplary embodiment, and a substrate 212. The aligner apparatus 1105' is generally similar to apparatus 105' described before and shown in FIGS. 4 and 5 except as otherwise noted below. Similar features are similarly numbered. The substrate aligner apparatus 1105' generally has a support section 1010, and two substrate supports 1318, 1319. The support section 1010 generally operates as a foundation or base for the aligner apparatus 1105'. The support structure 1010 may have mounts (not shown) for mounting the aligner apparatus to structure of a processing apparatus similar to apparatus 100 in FIG. 1. The support structure 1010 may have a casing or cover 1010C for enclosing and protecting components and intervals (described further below) of the support structure from hostile conditions (e.g. moisture or corrosive atmosphere). FIG. 11A shows the aligner apparatus 1105' with the casing 1010C removed from the support section 1010. The shape of the casing 1010C shown in FIG. 11 is merely exemplary and the casing may have any desired shape. The substrates supports 1318, 1319 are mounted to the aligner apparatus support structure 1010 as shown. Each substrate support 1318, 1319 is capable of holding one (or more) substrate(s) similar to substrate 212 as will be described below. In FIGS. 11-11A, substrate 212 is shown supported on support 1319 for example purposes. In this exemplary embodiment, one substrate support 1318 is movable relative to the support section. The other substrate support 1319 may be fixed relative to the support structure. In alternate embodiments, both substrate supports may be movable with respect to the support structure. The aligner apparatus 1105' has a drive system 1321 located in support section 1010 for moving the substrate support 1318 and effecting alignment of the substrate 212 as will be described further below.

Figure 12:
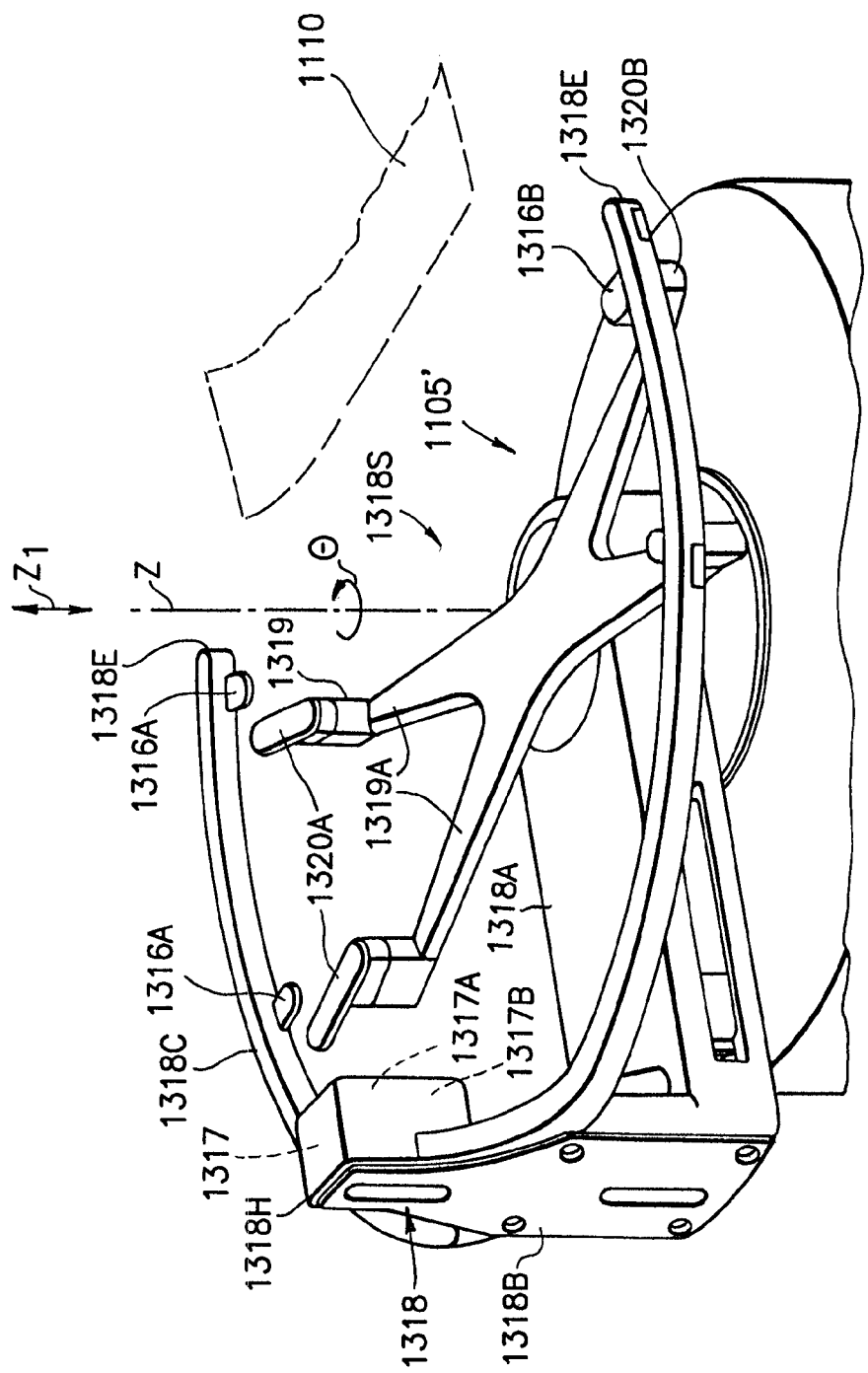
FIG. 12 is a partial perspective view of the aligner apparatus in FIG. 11, showing a movable support of the apparatus in a different position.

Referring now also to FIG. 12, there is shown a partial perspective view of the aligner apparatus 1105'. The substrate 212 is omitted for clarity, and substrate support 1318 is moved to a different position from that shown in FIGS. 11-11A. In this exemplary embodiment, the substrate support 1318 has a base member 1318A that extends generally radially and connects the substrate support 1318 to a rotatable shaft of the drive system 1321 (in a manner similar to the connection between base member 318 to drive section 321 shown in FIG. 5). The base member 1318 is vertically positioned to avoid interfering with structure of the other substrate support 1319 as will be seen below. As shown in FIG. 12, the substrate support 1318 may have a generally upstanding member 1318B, projecting generally vertically from the base member 1318. Substrate support 1318 may also have span member 1318C extending laterally as shown from the base member 1318A. In alternate embodiments, the movable substrate support, and its members, may have any other desired shape. The span member 1318C has a general bent around, in this exemplary embodiment arcuate, shape extending around axis of rotation Z of the rotatable shaft of drive system 1321. As may be realized, the axis of rotation Z is located substantially coincident with the geometric center of the substrate support 1318 (and shall be referred to denote both rotation axis and geometric center from herein). The radius of the arcuate shaped span member 1318C may be greater than the expected radius of the substrate 212 (e.g. substrate 212 may be a 200 mm, 300 mm wafer or any desired size wafer). This ensures that a clearance gap is established with the structure of substrate support 1319, thereby allowing the substrate supports 1318, 1319 to be moved one past the other in the vertical direction (indicated by arrow $Z_1$ in FIG. 12), and allowing the support 1318 to be rotated freely and continuously about axis of rotation Z (in the direction indicated by arrow A) without interference with support 1319. As seen in FIG. 12 the opposite ends 1318E of the span member 1318C are separated by a gap. The gap between ends 1318E of the span member is sized sufficiently wide to allow an end effector, for example similar to end effector 106, which may be an edge gripping end effector, to pass through the substrate support 1318. This may allow for expedited alignment process and hence greater throughput as will be described in greater detail below. In this exemplary embodiment, the span member 1318C has substrate support pass or fingers 1316A, 1316b. In this embodiment, the span member has two pairs 1316A, 1316B of support pads, one pair disposed on opposite sides of the span member. The support pads 1316A, 1316B are distributed on the span member so that any three pads may stably support and hold the substrate 212 on substrate support 1318 even when the support is moving in the $Z_1$, or θ directions. The support pads 1316A, 1316B are substantially similar to each other and substrate supports 316A, 316B shown in FIG. 5. The support pads 1316A, 1316B may be configured to provide a passive edge grip to a substrate 212 seated on the substrate supports 1318. The pads 1316A, 1316B may be covered with or made for example from Kalrez® elastomer or any other suitable contact grip material capable of providing a suitable friction coefficient to hold the substrate under the inertial loads generated during movement (rotation) of the substrate support 1318.

Still referring to FIG. 12, in this exemplary embodiment, the substrate support 1318 has a sensor head 1318A mounted thereon. In alternate embodiments, more than one sensor head may be mounted on the rotatable substrate support. The sensor head 1318H has a sensing device 1317 capable of sensing the presence, and hence lack thereof, of the peripheral edge of the substrate 212. In this embodiment, the sensing device may be a through beam type sensing device. Accordingly, the sensing device 1317 may have an emitter 1317A, capable of emitting a beam of electromagnetic radiation, for example a laser or LED. The sensing device 1317 may also have a detector 1317B capable of detecting the beam of electromagnetic radiation from the emitter, for example a CLD or photocell. The emitter and sensor are spaced apart to receive and sense the peripheral edge of the substrate 212, when gated on the substrate support 1319, as will be described further below. The sensing device 1317 may if desired be a linear/sheet or array type of sensing device. The emitter 1317A, may use suitable optical devices, such as lenses, beam splitters and collimators (not shown) to provide a linearly distributed beam rather than a columnated or spot beam. The detector 1317B may employ an array of detectors, such as a CLD, distributed along the illumination path of the beam. As may be realized, detector 1317B is capable of sensing the linear position along the sensing array of the peripheral edge of the substrate. Hence, as the sensor head is rotated relative to the substrate, the sensing device is capable of detecting the relative position of the substrate peripheral edge, thereby providing a suitable signal/data to determine eccentricity of the substrate on the substrate support 1319. As also may be realized, the array sensor device is capable of detecting the fiducial notch in the substrate to establish the alignment position of the substrate. In alternate embodiments, the emitter in the sensing device may emit a columnated beam that is detected by the detector, if sensing the fiducial and not substrate eccentricity is desired.

Still referring to FIG. 12, the substrate support 1319 in this exemplary embodiment is nested as shown in the span member 1318C of support 1318. The substrate support 1319 is located generally above the sensor head base member 1318A. The substrate support 1319 has a span member 1319A centered substantially coincident with axis Z. The substrate support 1319 may be connected to a substrate support member similar to member 322, also located substantially along axis Z. In this embodiment, the span member 1319A has two pairs of support fingers, though in alternate embodiments the span member may have any desired shape, terminating in upward extension members 1319B. In alternate embodiments there may be any number of upward extension members depending from the span member 1319A. The extension members 1319B, at opposite ends of span 1319A are spaced sufficiently apart to allow an edge gripping end effector to pass in between. The upward extension members 1319B have rest pads 1320A, 1320B as shown. The substrate support rest pads 320A, 320B are configured to support the bottom peripheral edge of substrate 212. The extension members 1319B have a suitable height so that the end effector, similar to end effector 106 may be located between the extension members 1319b, and not interfering with span member 1319A when the substrate 212 is seated on rest pads 1320A, 1320B. Accordingly, support 1319 of lid has a pass-through configuration allowing the end effector to pick and place substrates directly onto substrate support 1319 for increased throughput. The rest pads 1329A, 1320B may overlap at least in part the sensor head device 1317A of sensor head 1317 (similar to pads 1320A, 1320B in FIG. 5). Rest pads 1320A, 1320B may actively or passively grip substrate 212. Rest pads 1320A, 1320B or at least a portion thereof in way of sensor devices 1317A, 1317B may also be made of a transparent material so that a beam of radiation from sensors 1317A, 1317B, capable of detecting the edge of the substrate 212 when seated on rest pads 1320A, 1320B, passes through the portion of the rest pads 1320A, 1320B in way of the beam so as to be able to detect the edge of the substrate 212 and the fiducial on the edge. The material for the rest pads 1320A, 1320B may for example be quartz, optically transparent to light beams, or any other suitable material. In alternate embodiments, when a sensor such as a reflective sensor is used, the rest pads 1320A, 1320B may be of a non-transparent material. In alternate embodiments, the substrate support system 1319 may have any other desired configuration.

Figure 13:
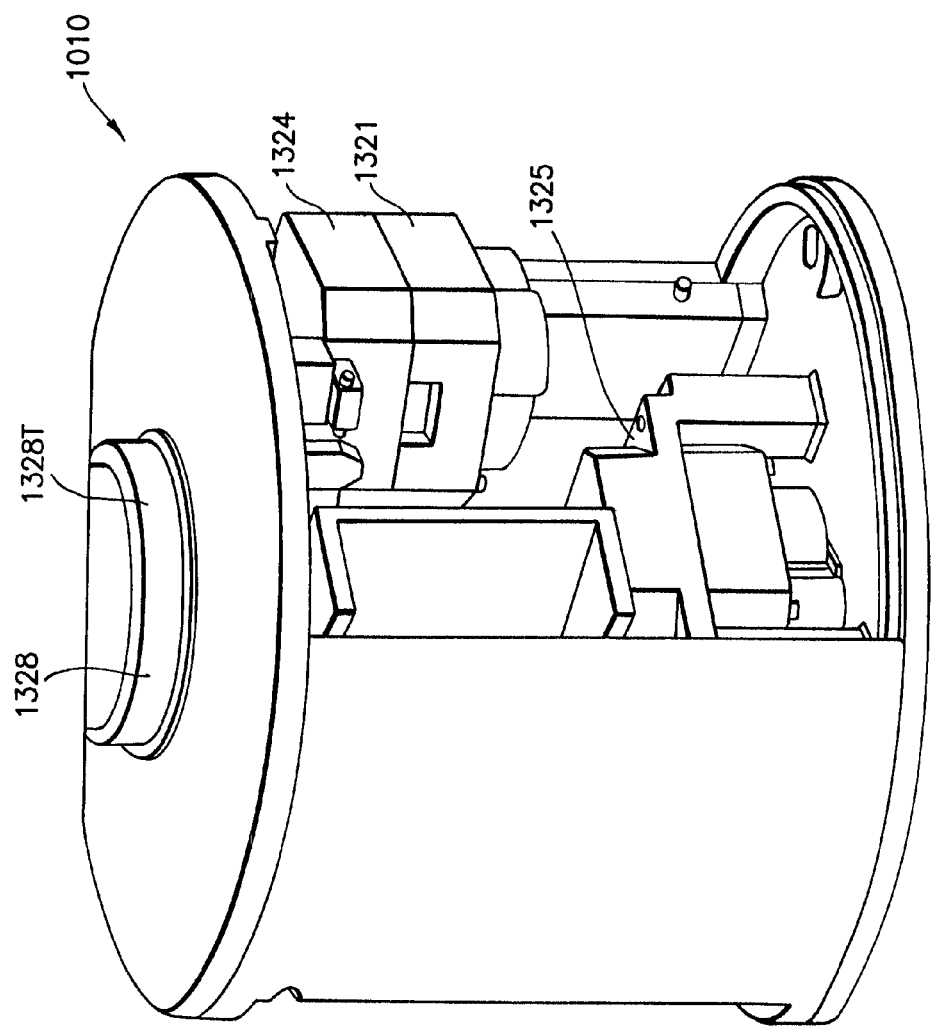

Referring now to FIG. 13, there is shown a cutaway perspective view of the aligner support structure 1010. FIG. 13 also shows the aligner drive system 1321 located in the support structure. In this embodiment, the drive system 1321 may have a rotational drive section 1324 (generating the rotation of the substrate support about the Z axis) and a linear drive section 1326 (for generating the $Z_1$ linear motion of the substrate support). FIG. 13A shows a cross-sectional view of the linear drive section 1325 and FIG. 13*b* shows a cross-sectional view of the rotational drive section 1324. The rotational drive section 1324 generally has a motor 1326 and a shaft 1328. The motor 1326 is coupled to the shaft 1328 to rotate the shaft as will be described further below. The shaft 1328 is coupled to the substrate support 1318 (in particular to base member 1318A of support 1318, see FIG. 12) as described before. In this embodiment shaft 1328 is fixed to support 1318 so that shaft and support rotates as a unit. Referring again to FIG. 13B, the motor 1326 is located in a suitable housing 1332. The motor 1326 is a rotary motor of any suitable type, such as a brushless AC, DC or stepper motor. The motor rotor, which is affixed to the motor drive shaft has an absolute encoder 1334 (located in encoder housing 1334H) that is communicably connected to the controller (not shown) to determine the absolute position of the rotor/shaft. In the exemplary embodiment shown, the motor 1326 is mounted to the support structure 1010 offset from the shaft 1328 rotating the substrate support 1318. As may be realized, mounting the rotational section motor 1326 offset from the shaft 1328 allows the profile (i.e. height) of the support structure 1010 to be reduced as the assembly height of the drive system components assembled to form the drive system 1321 is reduced. For example, the rotational drive components and linear drive components may overlap in order to minimize drive system height. In alternate embodiments, the motor and output shaft of the rotational drive section may have any other desired configuration, such as for example co-axial. As seen in FIG. 13B, shaft 1328 is held in the support structure 1010, by suitable bearings, to rotate about axis Z. Shaft 1318 may be hollow. Post 1322, to which substrate support 1319 is fixed (in a manner similar to substrate 319 is fixed to shaft 322 as shown in FIG. 5) may extend within hollow shaft 1328 as shown. Suitable rotational and linear bearings (not shown) may be located inside shaft 1328 to stably hold post 1322, and post 1322 and shaft 1328 may be concentric and coaxial with axis Z. The top 1328T of shaft 1328 projects above the cover of support structure 1010 (see FIG. 18) providing a suitable connecting section for attachment of substrate support 1318. The shaft 1328 has a slip ring 1336 mounted thereon providing a suitable rotating interface for power and data/communication lines (not shown) feeding the powered or operable components (e.g. the sensor head 1318H) on the substrate support 1318. As may be realized, the slip ring 1336 on shaft 1328 allows for continuous rotation of the substrate support 1318. In this embodiment, the motor 1326 is coupled to shaft 1328 by a suitable transmission 1330. The transmission 1330 in this embodiment has drive pulleys 3300, fixed on motor shaft/drive pinion 1326S, and idler pulley 1330P fixed on to shaft 1328. The drive pulley 1330*d* axis/idler pulley 1330P are drivingly connected by an endless belt, allowing continuous rotation of shaft 1328 and hence substrate support 1318 about axis Z.

Referring now again to FIG. 13A, the linear drive section 1325 generally has a linear drive 1338 and a lift pad/post/carriage 1340. The linear drive 1341 is coupled to lift pad 1340 to effect rectilinear motion of the lift pad 1340 relative to support structure 1010 as will be described below. (e.g. in this exemplary embodiment the linear pad motion may be up and down in the direction indicated by arrow $Z_1$ in FIGS. 13A, 12). In this embodiment, the shaft 1328 and motor 1326 of rotational drive section 1324, may be fixed to the linear pad so that shaft 1328, motor 1326 (and thereby support 1329) and lift pad 1340 move as a unit in the $Z_1$ direction. In alternate embodiments, the support post 1322 of the substrate support 1319, may be fixed to the lift pad 1340 so that support post 1322 (with substrate support 1319) and lift pad 1340 move as a unit in the $Z_1$ direction. Accordingly, in this alternate embodiment, it is substrate support 1319 that is movable in direction $Z_1$ (see FIG. 12) and substrate support 1318 may be capable of rotation, about axis Z, but not of linear movement in $Z_1$. In the exemplary embodiment, if the post 1322 and substrate support 1319 held thereon, are fixed relative to support structure 1010, the bottom end of post 1322 may be fixed in any suitable manner to structure 1010. Referring back to FIG. 13A, linear drive 1338 may have a motor 1342, such as a brushless AC, DC or stepper motor or any other suitable motor type, located in motor housing 1342C.

The motor rotor is fixed to a motor drive shaft 1342S, that in turn is coupled to a base or lead screw 1348 so that shaft 1342S and screw 1348 turn as a unit. The rotor or shaft has an absolute encoder 1346 mounted thereon for position determination. As seen in FIG. 13A, the linear drive 1338 may have linear bearings 1344 riding rails affixed to support structure supports 1010S. The linear bearings 1344 are mounted to a slide collar 1350 that rides on lead screw 1348. As may be realized, the linear bearings 1344 rotationally fix the slide collar 1350, relative to support structure 1010, but allow the collar to travel freely in the $Z_1$ direction. Hence rotation of the lead screw 1348 causes the slide collar 1350 to travel linearly in the $Z_1$ direction. Lift pad 1340 is fixed to the slide collar to move as a unit with the slide collar.

The operation of aligner 1105' is substantially similar to operation of aligner 105' described before and shown in FIG. 8. Referring again to FIGS. 11-11A, the substrate transporter enters the aligner and places substrate 212 on support 1319 (blocks G01, G02 in FIG. 8). The pass through configuration of substrate support 1318 as well as substrate support 1319 (see FIG. 12) allow the sensor scanning, similar to block 603 in FIG. 8, to commence immediately on placement of the substrate 212 onto support pads of support 1319. Upon placing the substrate 212 onto support 1319, the transporter end effector 1110 (seen in phantom in FIG. 12) is located within the space 1318E (between the opposite ends 1318E of span member 1318C) with sufficient clearance between the span member ends 1318E and the end effector 1110 that the support 1318, and hence sensor head 1318H, may commence rotation to scan the edge of substrate 212 without interference with the withdrawing effector. As may be realized, rotation of support 1318 and withdrawal of end effector 1110 are synchronized by the controller (not shown) to prevent contact between support 1318 and end effector 1110. As may also be realized, in this embodiment, and different from block 603 in FIG. 8, the end effector withdraws from the aligner when the sensor head 1318H rotates and scans the substrate. Otherwise, the scan in block 603 of FIG. 8 is the same in this embodiment. Having located the substrate fiducial, the substrate 212 is transferred to support 1318 (e.g. raising support 1318 or lowering support 1319) similar to block 604, the substrate support 1318 rotates the substrate to the post alignment position, similar to block 605, and the substrate is transferred to the end effector, similar to block 606. As described before, in this embodiment, rotation to scan, similar to block 603, with empty support 1318 can be performed at a higher speed than if the substrate was being rotated during scanning as in conventional aligners. In the case the sensing device 1317 in the sensor head has a sheet array as described, and hence the eccentricity of the substrate 212 is also established during scanning similar to block 603, then the end effector 1110 may be suitably positioned relative to the substrate at transfer, similar to block 606, to correct the substrate eccentricity on transfer.

Figure 14:
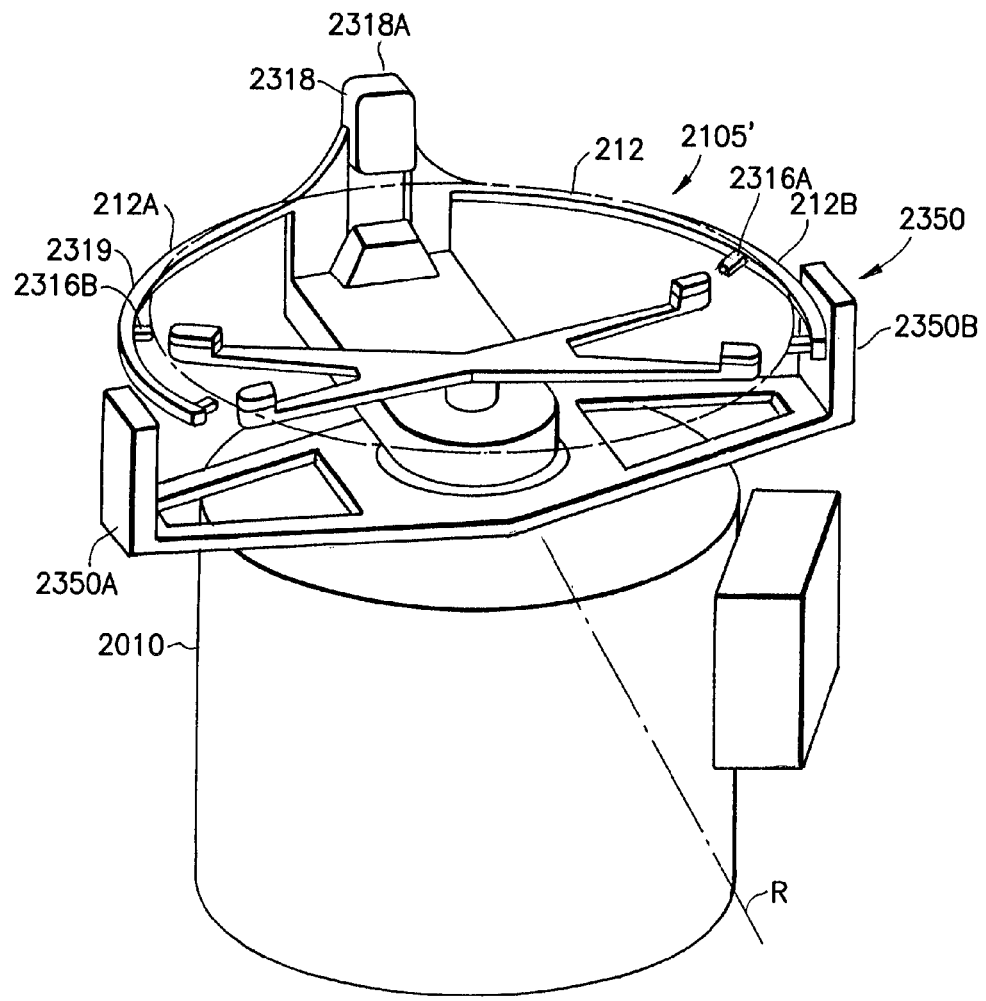
FIG. 14 is a schematic perspective view of a substrate aligner apparatus in accordance with still yet another exemplary embodiment and substrate 212.

Referring now to FIG. 14, there is shown a schematic perspective view of an aligner apparatus 2105' in accordance with another exemplary embodiment. Except as otherwise noted, aligner 2105' is substantially similar to aligner 1105' described before and shown in FIGS. 11-13B. Similar features are similarly numbered. In this embodiment, the aligner 2105' has support structure 2010, rotatable substrate support 2318, and another substrate support 2319. Aligner 2105' also has a mapper 2350 as shown. The mapper 2350 in this embodiment has a pair of sensor heads 2350A, 2350B. The sensor heads 2350A, 2350B are substantially similar to each other. Each sensor head 2350A, 2350B has a housing defining a channel and a suitable sensor capable of sensing the presence of a substrate passing through the channel. In this embodiment the sensor may be a through beam sensor emitting a beam across the channel that when broken by passage of a portion of the substrate through the channel, causes a signal indicating the presence of the substrate. The sensor heads 2350A, 2350B of the mapper are mounted by suitable frame to the support structure 2010 as shown. The sensor heads 2350A, 2350B are located athwart the transport path R of the substrate 212 when transported by the transporter into the aligner. The sensor heads 2350A, 2350B are positioned so that one or both sides of the opposite sides 212A, 212B of the peripheral edge of the substrates passes through the corresponding sensor head 2350A, 2350B when the substrate enters the aligner 2105'. Accordingly, the mapper 2350 is capable of determining the rough or fine eccentricity of the substrate prior to substrate placement onto substrate supports 2318, 2319. This in turn allows the transporter, similar to transporter 1110 in FIG. 12, to more accurately position the substrates 212 onto the substrate supports 2318, 2319. In alternate embodiments, any other suitable coarse positioning device may be used to position the substrate relative to the substrate supports.

Figure 15:
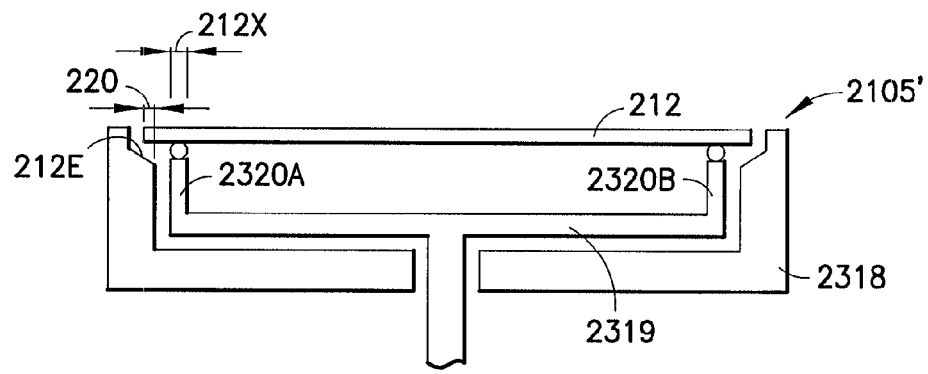
FIG. 15 is a schematic partial cross-sectional view of substrate holders of the aligner apparatus in FIG. 14.

Referring now to FIG. 15, there is shown a schematic cross-sectional view of the substrate supports 2318, 2319 of the aligner 2105'. In this exemplary embodiment, the substrate supports 2318, 2319 have support pads 2320A, 2320B to support the substrate placed thereon. The support pads 2320A, 2320B are configured to contact the underside of the substrate. Moreover, as shown in FIG. 15, support pads 2320A, 2320B are configured to contact the substrate, away from the substrate edge 212E, but within the SEMI standard defined exclusion region 212X around the perimeter of the substrate. By way of example, the SEMI standards define an exclusion region around the substrate perimeter of about 3.0 mm. The support pads 2320A, 2320B are thus arranged so that the contact surfaces of the pads, contact the substrate supported thereon, only within the exclusion region 212X without contacting the edge region of the substrate. The configuration of the support pads shown in FIG. 15 is merely exemplary, and in alternate embodiments, the support pads may have any other desired configuration. The support pads 2320A, 2320B may be located sufficiently away from the substrate edge so that the substrate fiducial 220 (see FIG. 3) is not positioned over a support pad when the substrate is supported on the supports pads. For example, the SEMI standards define the fiducial radial depth at about 1 mm. The support pad contact surface may, for example, be located and sized to extend no closer to the edge of the substrate than about 1.5 mm. Hence, this avoids placement of the fiducial 220 over the support pads. Moreover, as the fiducial is not positioned over the support pads 2320A, 2320B of the substrate support, the support pads may be made from a material other than a material transparent to the sensing device in sensor head 2318H (see FIG. 14). Support pads 2320A, 2320B may also be clear of (i.e. not overlapped with) support pads 2316A, 2316B of support 2318, thereby avoiding any interference therebetween during substrate transfer between substrate supports 2318, 2319. Accordingly, this eliminates a possible source of retries resulting in an improvement in throughput of the aligner.

Figure 16:
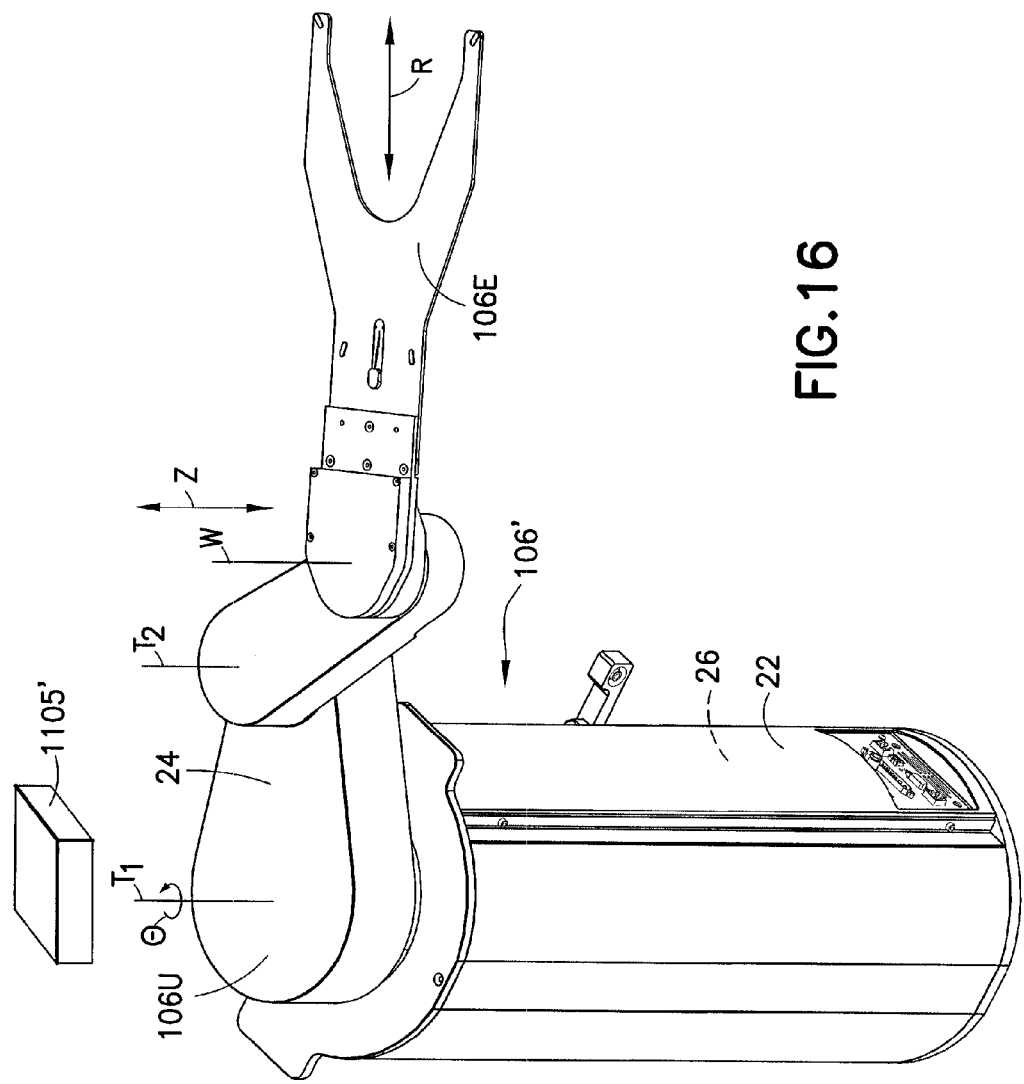
FIG. 16 is a schematic perspective view of a substrate aligner apparatus and a substrate transporter of the substrate processing tool in accordance with another exemplary embodiment.

The aligner 105', 1105', 2105' described before may be mounted anywhere on the processing tool 100 (see FIG. 1) structure. The aligner may also be mounted on the substrate transporter of the processing tool to provide what may be referred to as a minimum overhead arrangement. FIG. 16 shows a perspective view of aligner 1105' (illustrates schematically) and substrate transporter 106' in accordance with an exemplary embodiment. The aligner 1105' is shown removed from the substrate transporter 106' for clarity the transporter 106' is a representative substrate transporter, shown in FIG. 16 as having a support section 22 and movable arm 24 for example purposes. In alternate embodiments, the transporter may have any suitable configuration. The movable arm 24 is shown in FIG. 16 as having a general scara type configuration also for example purposes. The arm 24 is supported atop the support section 22. The arm 24 has movable arm links capable of being rotated, by drive section 26, about respective shoulder $T_1$, elbow $T_2$ and wrist W axes of rotation to articulate the arm. The proximal arm link 106U rotates about the shoulder axis $T_1$. The distal arm link 15 on end effector 106E, rotatable about wrist axis W. In the embodiment shown in FIG. 16, end effector 106E is shown as a forked effector with edge grips, though any suitable end effector configuration may be used. The aligner 1105' may be mounted to proximal arm link 106U. The aligner 1105' may be positioned on the arm link so that the axis of rotation Z (see FIG. 12) of the aligner is substantially coincident with shoulder axis of rotation $T_1$. The aligner support structure 1010, see FIGS. 11 and 13, may be located, at least in part, inside the shell of the proximal arm link 1060. The aligner substrate supports 1318, 1319 are located to allow the end effector 106E to be rotated so that a substrate carried thereon may be positioned with its center proximate to shoulder axis $T_1$, and over the substrate supports of the aligner. Transfer of substrates between end effector 106E and substrate supports 1318, 1319 may be effected in this exemplary embodiment with the substrate support movable in the $Z_1$ direction (see FIG. 12). Otherwise aligner operation is similar to that described before.

Figure 17:
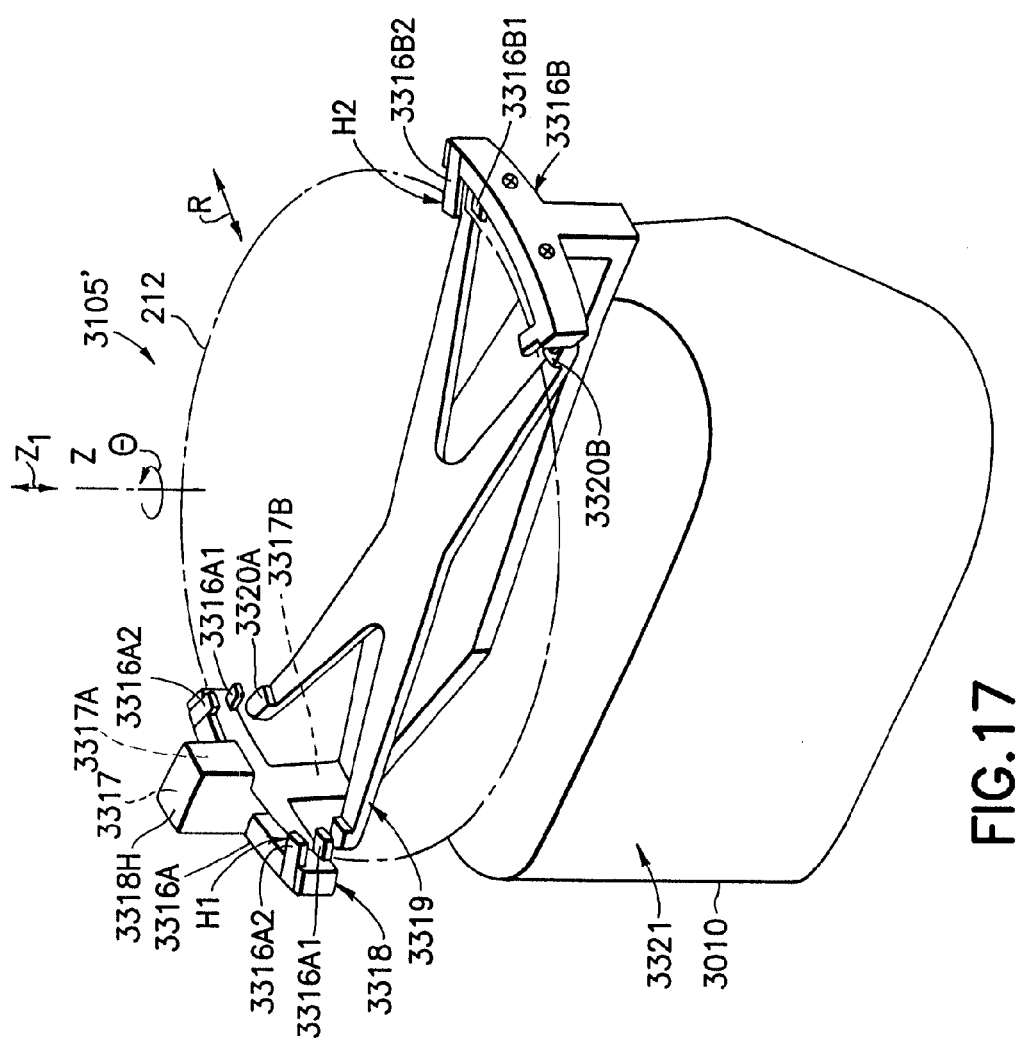
FIG. 17 is a schematic perspective view of a substrate aligner apparatus in accordance with another exemplary embodiment, and a substrate 212.

Referring now to FIG. 17, there is shown a schematic perspective view of an aligner apparatus 3105' in accordance with another exemplary embodiment. Except as otherwise noted below aligner 3105' is substantially similar to aligner 1105' described before. Similar features are similarly numbered. As shown, aligner 3105' also generally has a support section 3010 and two substrate supports 3318, 3319. The substrate supports 3318, 3319 are generally supported from the support section 3010. As seen in FIG. 17, support 3319 is located within support 3318 and hence supports 3318, 3319 may be respectively referred to as outer and inner supports.

In this embodiment, outer support 3318 may be fixed relative to the support section 3010. The inner support 3319 may be movable relative to the support section 3010 as will be described below. In alternate embodiments, both outer and inner substrate supports may be movable relative to the support structure 3010. As shown in FIG. 17, substrate support 3318 has opposing support arms 3316A, 3316B extending from a base member 3318A. In this embodiment, each of the support arms 3316A, 3316B has two vertically spaced pairs of support pads 3316A1, 3316A2, 3316B1, 3316B2. The support pads 3316A, 3316A2, 3316B1, 3316B2 of each pair are substantially coplanar with each other and with the support pads of a corresponding pair on the opposing support arm 3316A, 3316B. By way of example, pads 3316A, are coplanar with each other and with opposing pair 3316B1. Opposing substrate pad pairs 3316A1, 3316B1 form substrate hold H1, and opposing substrate pad pairs 3316A2, 3316B2, form substrate hold H2 on substrate support 3318. The substrate holds H1, H2 may be used for buffering substrates in the aligner as will be described below. In alternate embodiments, the substrate support may have more substrate buffers as desired. The vertical spacing between the corresponding substrate pad pairs 3316A, 3316A2, 3316B1, 3316B2 on the respective support arms is sufficient to allow a substrate transporter, similar to transporter 106 in FIG. 5 to transport a substrate, along path R, R, to position in substrate hold 1. As shown in FIG. 17, sensor head 3318H is mounted to the structure of substrate support 3318. The sensor head 3318H has a suitable sensing device 3317. In this embodiment, sensing device 3317 may be a through beam sensing device, similar to sensing device 1317 described before, capable of sensing the presence of a substrate. The sensing device may have an emitter 3317A (e.g. laser, LED) and emission detector (e.g. CCD, photocell) 3317B located as shown capable of sensing fiducial 220 (see FIG. 3) in the peripheral edge of a substrate located at either hold H1 or hold H2 as will be described below.

Figure 18:
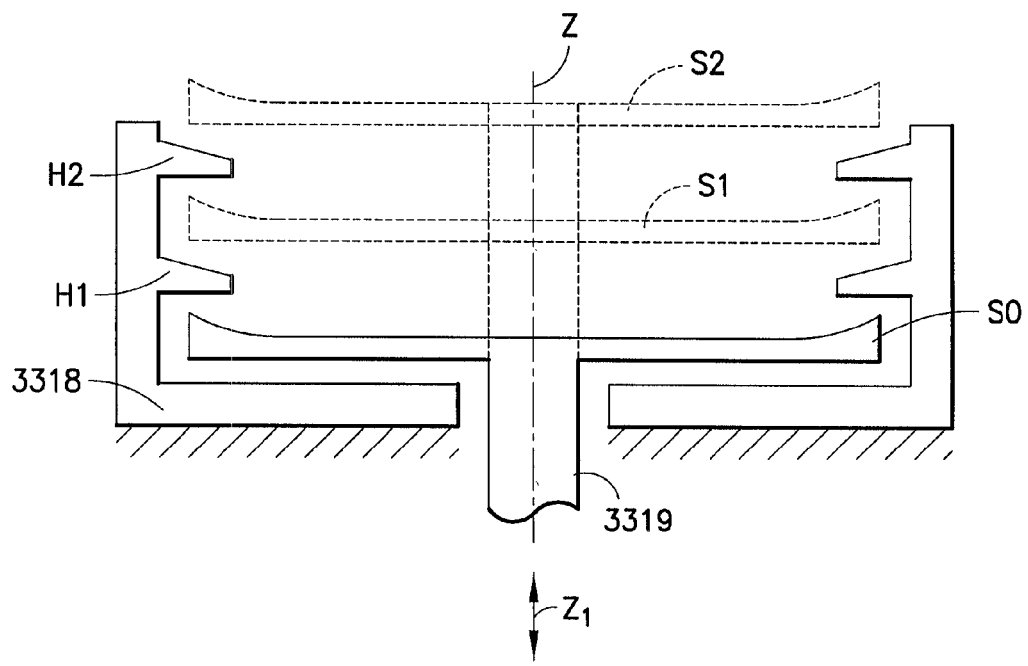
FIG. 18 is a schematic cross sectional view of substrate supports of the substrate aligner apparatus in FIG. 17.

Referring still to FIG. 17, the other substrate support 3319 has a configuration that is substantially similar to substrate support 1319 in FIG. 12. The substrate support 3319 has support pads 3320A, 3320B to form a substrate hold location on support 3319. In alternate embodiments, the substrate support may have more than one substrate hold location, to buffer one or more substrates. The support pads 3320A, 3320B may be similar to pads 1320A, 1320B shown in FIG. 12. For example, the pads 3320A, 3320B may be edge gripping pads, made of material transparent to sensing device 3317. In alternate embodiments, the support pads may be similar to 2320A, 2320B, shown in FIG. 15, located to contact the bottom of the substrate 212 within the SEMI defined exclusion zone, and away from the edge of the substrate and its fiducial as previously described. The substrate support 3319, in this exemplary embodiment, is rotatable about axis of rotation Z, relative to the support section 3010, and substrate support 3318. The substrate support 3319 may also be moved rectilinearly in direction indicated by arrow $Z_1$. The substrate support 3319 is connected to a drive system 3321, located in support 3010, having both rotation and linear drive sections, similar to drive sections 1324, 1325 shown in FIGS. 13, 13a-13b, capable of rotating support 3319 about the Z axis and linearly moving the support in the direction indicated by arrow $Z_1$. FIG. 18 is a cross-sectional view of substrate supports 3318, 3319 of aligner 3105'. As seen in FIG. 18, the substrate support 3319 is capable of being moved, by drive system 3321 in direction $Z_1$ from its register position So, to scan positions S1, S2 (shown in phantom in FIG. 18). The scan positions are commensurate with the hold of buffer positions H1, H2 of substrate support 3318. Hence, in this embodiment, there are two scan positions. Scan position S1 of support 3319 corresponds to hold H1 of support 3318, and scan position S2 corresponds to hold position H2. In alternate embodiments, the substrate support movable in the $Z_1$ direction may have more scan positions.

Figure 19A:
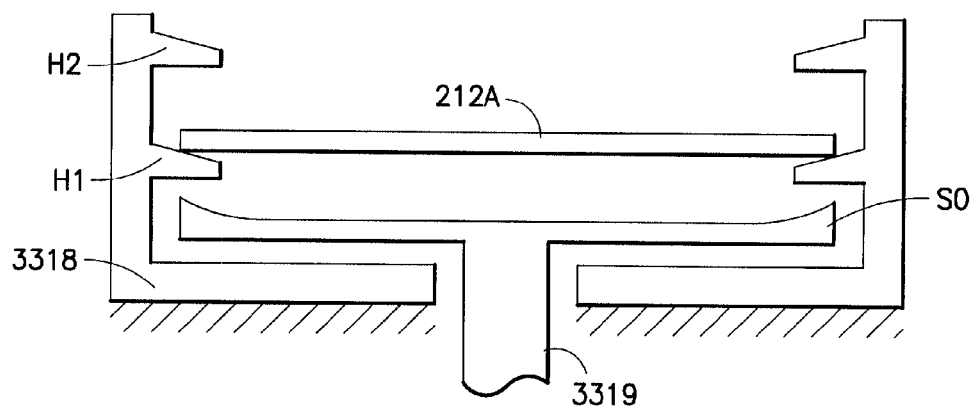
FIGS. 19A-19D are schematic cross sectional views of the substrate supports in FIG. 18 showing the substrate supports and substrates located in different respective positions.
Figure 19B:
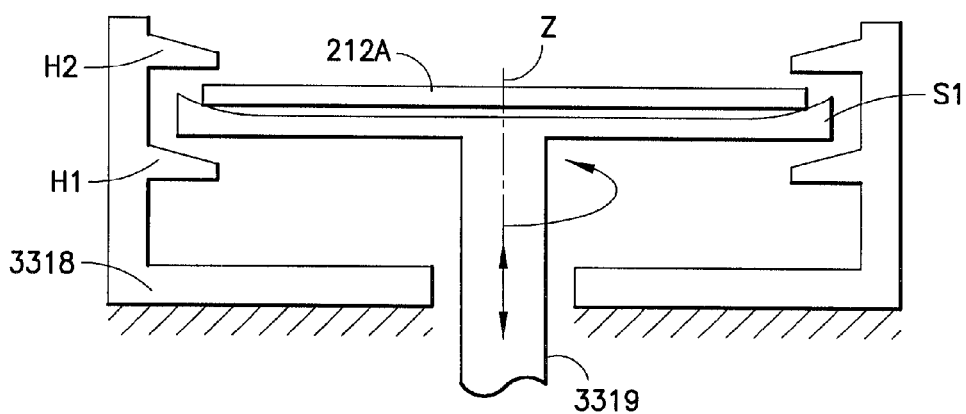
Figure 19C:
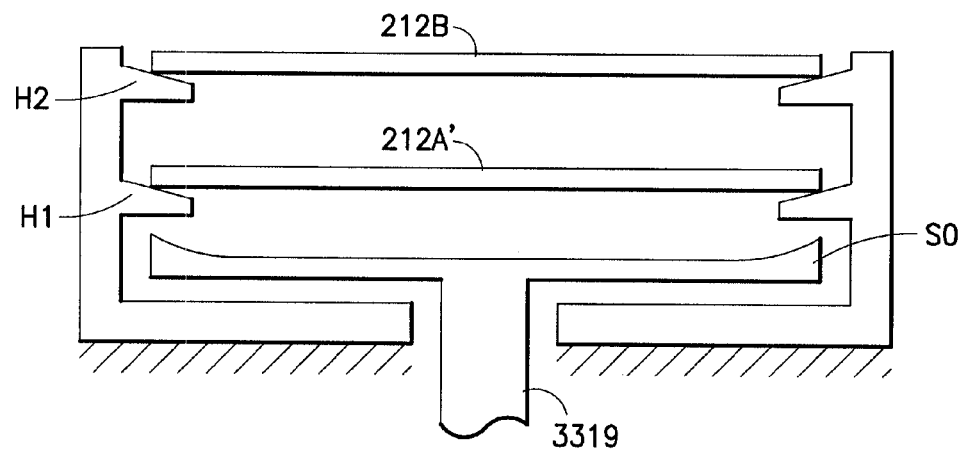
Figure 19D:
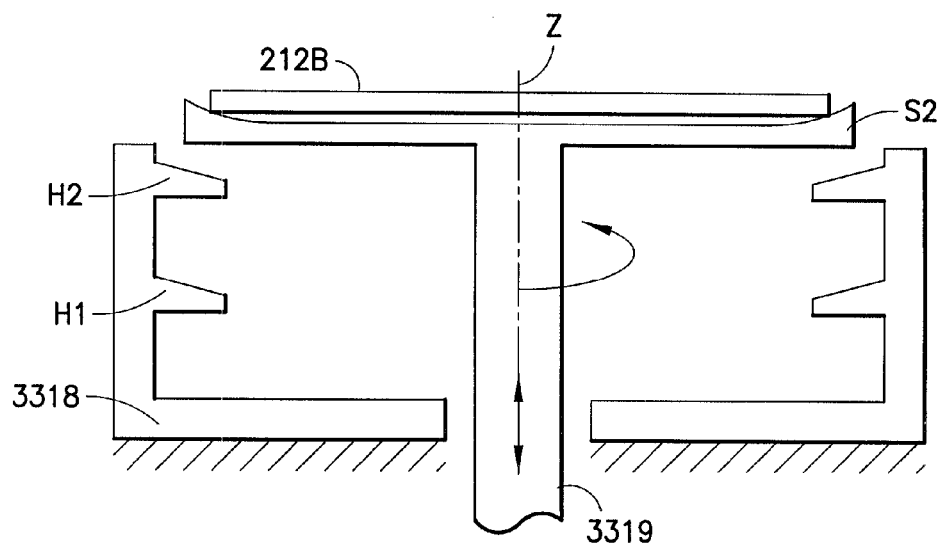

FIGS. 19A-19D are other cross-sectional views of the substrate supports 3318, 3319 of aligner 3105' respectively showing the substrate supports in four different conditions that serve to illustrate operation of the aligner with the multi-layer buffering system. Specifically, in FIG. 19A a substrate 212A is placed, by a substrate transporter similar to transporter 106, in hold H1 of substrate support 3318. The other substrate support 3319 is located in register position So as shown. The condition depicted in FIG. 19A may be at the start of a batch alignment operation. In FIG. 19B, the substrates support is raised to scan position S1. The substrate 212A, shown resting in hold H1 in FIG. 19A, is picked from hold H1 by support 3319 and positioned in scan position. The aligner may be provided with a suitable optical character recognition reader (OCR) (not shown) located to read indicia on the substrate 212A when held by support 3319 in position S1. In this position, the substrate support 3319 may be rotated about axis Z causing the sensing device 3317 (see also FIG. 17) to scan the substrate periphery and identify fiducial 220 as substrate 212A rotates with the support. Rotation of the support 3314 may also allow the OCR to read the indicia in its field of view. With the fiducial located, support 3319 still in position S1 may be rotated to provide substrate 212A with the desired post alignment position. In FIG. 19C, the substrate support 3319 is returned to the register position So (or if not the register position, a position below hold H1). As the support 3319 moves towards its register position, it places the now post-alignment positioned substrate 212A' on hold H1. Substrate 212B is buffered in hold H2, having been placed there by the transporter either during positioning of substrate 212A with support 3319, or when the support 3319 is placing post-alignment positioned substrate 212A' on hold H1. The transporter may swap substrate 212B with substrate 212A', removing the aligned substrate from the aligner. In FIG. 19D, the substrate support 3319 is raised to scan position 52. Substrate 212B, shown buffered hold in H2 in FIG. 19C, is picked from hold H2 by support 3319 and positioned to be scanned. The aligner may have another OCR reader (not shown) located to read indicia on substrate 212B when held by support 3319 in position 52. The support 3319 may again be rotated about axis Z allowing the sensing device to scan the periphery of the substrate 212B to locate the fiducial. Upon locating the fiducial, the support 3319 is rotated to place the substrate thereon in its post-alignment position. The support 3319 may again be returned to a position similar to that shown in FIG. 19C. The substrate holds H1, H2 of support 3318, may each hold a substrate, similar to what is shown in FIG. 19C, except that the buffered substrate would be in hold H1, and the aligned substrate 212B would be in hold H2. The above process may be repeated as desired.

As noted before, in alternate embodiments, substrate support 3318 may be movable in the $Z_1$ direction, while substrate support 3319 may be rotatable about the Z axis but fixed in direction $Z_1$. As may be realized, the alignment process is carried out in substantially the same manner as shown in FIGS. 19A-19D, except that the vertical (i.e. $Z_1$) movements are carried out by $Z_1$ movable support 3318 rather than support 3319 as shown in the figures. Accordingly, support 3319 has but one $Z_1$ position, similar to position So. However, the $Z_1$ movable support 3318 can be displaced down so that the apparatus position of the support 3319 relative to support 3318 and holds H1, H2 are similar to position S1, S2 shown in FIGS. 18 and 19A-19D.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate aligner apparatus comprising:
    a frame adapted to allow a substrate transporter to transport a substrate to and from the aligner apparatus;
    a substrate buffer system mounted to the frame and including a buffer frame with a first set of passive support pads depending from the buffer frame for holding a first substrate in a first plane such that each pad in the first set of passive support pads supports the first substrate in the first plane and with a second set of passive support pads depending from the buffer frame for holding a second substrate in a second plane such that each pad in the second set of passive support pads is independent of each pad in the first set of passive support pads and each pad in the second set of passive support pads supports the second substrate in the second plane;
    a substrate support system, distinct from the substrate buffer system, mounted to the frame and having a third set of passive support pads independent of the first and second sets of passive support pads for holding the first or second substrate in a third plane; and
    at least one sensing device mounted on the buffer frame for detecting a position determining feature of one of the first or second substrates;
    wherein the substrate buffer system and substrate support system are configured to move relative to each other with all passive support pads in the first set of passive support pads, the second set of passive support pads and the third set of passive support pads being radially passive, so as to be radially static relative to each other and the substrate, for effecting substrate transfer between the substrate buffer system and the substrate support, and substrate placement at a detection position of the at least one sensing device, and effecting detection of the position determining feature and orientation of a respective one of the first or second substrates and the first, second and third set of passive support pads being configured to contact a peripheral edge of a respective substrate.

2. The substrate aligner apparatus according to claim 1, wherein at least one of the substrate buffer system and substrate support system are configured to move relative to the other of the substrate buffer system and substrate support system and lift the first or second substrate from one of the substrate buffer system and the substrate support system.

3. The substrate aligner apparatus according to claim 1, wherein the substrate buffer system is fixedly mounted to the frame and the substrate support system is mounted to the frame by a drive system configured for rotatably and linearly moving the substrate support system for effecting the detection of the position determining feature of the first or second substrate and a repositioning of the first or second substrate.

4. The substrate aligner apparatus according to claim 1, wherein the substrate support system is fixedly mounted to the frame and the substrate buffer system is mounted to the frame by a drive system configured for rotatably and linearly moving the substrate buffer system for effecting the detection of the position determining feature of the first or second substrate and a repositioning of the first or second substrate.

5. The substrate aligner apparatus according to claim 1, wherein the substrate support system and substrate buffer system are movably mounted to the frame by a drive system, the drive system being configured to rotate the substrate support system relative to the frame and linearly move the substrate buffer system relative to the substrate support system for effecting the detection of the position determining feature of the first or second substrate and a repositioning of the first or second substrate.

6. The substrate aligner apparatus according to claim 1, wherein the substrate support system and substrate buffer system are movably mounted to the frame by a drive system, the drive system being configured to rotate the substrate buffer system relative to the frame and linearly move the substrate support system relative to the substrate buffer system for effecting the detection of the position determining feature of the first or second substrate and a repositioning of the first or second substrate.

7. The substrate aligner apparatus according to claim 1, wherein at least one of the substrate buffer system and the substrate support system are rotatably mounted to the frame by a drive system configured for generating rotation between the substrate support system and substrate buffer system relative to each other for effecting the detection of the position determining feature of the first or second substrate and a repositioning of the first or second substrate.

8. The substrate aligner apparatus according to claim 1, wherein the at least one sensing device is an optical sensing device.

9. A substrate processing apparatus comprising a substrate aligner as in claim 1.

10. A substrate aligner apparatus comprising:
    a frame adapted to allow a substrate transporter to transport a substrate to and from the aligner apparatus;
    a substrate buffer system mounted to the frame and including a buffer frame with a first set of passive support pads depending from the buffer frame for holding a first substrate in a first plane such that each pad in the first set of passive support pads supports the first substrate in the first plane and with a second set of passive support pads depending from the buffer frame for holding a second substrate in a second plane such that each pad in the second set of passive support pads is independent of each pad in the first set of passive support pads and each pad in the second set of passive support pads supports the second substrate in the second plane;
    a substrate support system, distinct from the substrate buffer system, mounted to the frame and having a third set of passive support pads independent of the first and second sets of passive support pads for holding the first or second substrate in a third plane; and at least one sensing device for detecting a position determining feature of one of the first or second substrates;

wherein the substrate support system and substrate buffer system are movably mounted to the frame by a drive system, the drive system being configured to rotate the substrate support system relative to the frame and linearly move the substrate buffer system relative to the substrate support system with all passive support pads in the first set of passive support pads, the second set of passive support pads and the third set of passive support pads being radially passive, so as to be radially static relative to each other and the substrate, for effecting substrate transfer between the substrate buffer system and the substrate support, and substrate placement at a detection position of the at least one sensing device, and effecting the detection of the position determining feature of the first or second substrate and a repositioning of the first or second substrate.

11. The substrate aligner apparatus according to claim 10, wherein at least one of the substrate buffer system and substrate support system are configured to move relative to the other of the substrate buffer system and substrate support system and lift the first or second substrate from one of the substrate buffer system and the substrate support system.

12. The substrate aligner apparatus according to claim 10, wherein the substrate support system is mounted to the frame by a drive system configured for rotatably and linearly moving the substrate support system for effecting the detection of the position determining feature of the first or second substrate and a repositioning of the first or second substrate.

13. The substrate aligner apparatus according to claim 10, wherein the substrate buffer system is mounted to the frame by the drive system configured for rotatably and linearly moving the substrate buffer system for effecting the detection of the position determining feature of the first or second substrate and a repositioning of the first or second substrate.

14. The substrate aligner apparatus according to claim 10, wherein the substrate buffer system and the substrate support system are rotatably mounted to the frame by the drive system that is configured for generating rotation between the substrate support system and substrate buffer system relative to each other for effecting the detection of the position determining feature of the first or second substrate and a repositioning of the first or second substrate.

15. The substrate aligner apparatus according to claim 10, wherein the at least one sensing device is an optical sensing device.

16. A substrate processing apparatus comprising a substrate aligner as in claim 10.

* * * * *